(12) United States Patent
Eid et al.

(10) Patent No.: US 12,482,779 B2
(45) Date of Patent: *Nov. 25, 2025

(54) HYBRID BACKSIDE THERMAL STRUCTURES FOR ENHANCED IC PACKAGES

(71) Applicant: Intel Corporation, Santa Clara, CA (US)

(72) Inventors: Feras Eid, Chandler, AZ (US); Joe Walczyk, Tigard, OR (US); Weihua Tang, Chandler, AZ (US); Akhilesh Rallabandi, Chandler, AZ (US); Marco Aurelio Cartas Ayala, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/593,775

(22) Filed: Mar. 1, 2024

(65) Prior Publication Data
US 2024/0203926 A1 Jun. 20, 2024

Related U.S. Application Data

(63) Continuation of application No. 16/785,014, filed on Feb. 7, 2020, now Pat. No. 11,948,906.

(51) Int. Cl.
 *H01L 23/00* (2006.01)
(52) U.S. Cl.
 CPC .... *H01L 24/29* (2013.01); *H01L 2224/29287* (2013.01); *H01L 2224/29293* (2013.01); *H01L 2224/29324* (2013.01); *H01L 2224/29339* (2013.01); *H01L 2224/29347* (2013.01); *H01L 2924/14* (2013.01); *H01L 2924/351* (2013.01)

(58) Field of Classification Search
 CPC .... H01L 23/3733; H01L 23/16; H01L 23/376
 See application file for complete search history.

(56) References Cited

U.S. PATENT DOCUMENTS

| 5,866,952 | A | 2/1999 | Wojnarowski et al. |
| 11,948,906 | B2 * | 4/2024 | Eid .......................... H01L 24/92 |

(Continued)

OTHER PUBLICATIONS

Non-Final Office Action from U.S. Appl. No. 16/785,014 notified Aug. 15, 2023, 8 pgs.

(Continued)

*Primary Examiner* — Dale E Page
*Assistant Examiner* — Ilner Jean Baptiste
(74) *Attorney, Agent, or Firm* — Essential Patents Group, LLP

(57) ABSTRACT

An integrated circuit (IC) die structure comprises a substrate material comprising silicon. Integrated circuitry is over a first side of the substrate material. A composite layer is in direct contact with a second side of the substrate material. The second side is opposite the first side. The composite layer comprises a first constituent material associated with a first linear coefficient of thermal expansion (CTE), and a first thermal conductivity exceeding that of the substrate. The composite layer also comprises a second constituent material associated with a second CTE that is lower than the first, and a second thermal conductivity exceeding that of the substrate.

20 Claims, 18 Drawing Sheets

(56) References Cited

U.S. PATENT DOCUMENTS

2013/0052760 A1   2/2013  Cho et al.
2020/0273772 A1*  8/2020  Uppal ................ H01L 23/4334

OTHER PUBLICATIONS

Notice of Allowance from U.S. Appl. No. 16/785,014 notified Dec. 13, 2023, 9 pgs.
Restriction Requirement from U.S. Appl. No. 16/785,014 notified Apr. 14, 2023, 7 pgs.

* cited by examiner

HYBRID BACKSIDE THERMAL STRUCTURES FOR ENHANCED IC PACKAGES

CLAIM OF PRIORITY

This application is a continuation of, and claims priority to, U.S. patent application Ser. No. 16/785,014, filed on Feb. 7, 2020 and titled "HYBRID BACKSIDE THERMAL STRUCTURES FOR ENHANCED IC PACKAGES," which is incorporated by reference herein in its entirety.

BACKGROUND

Semiconductor packages containing dies that are 150 microns thick or less may have particular challenges in mitigating local hotspots because of less effective lateral heat spreading relative to dies having larger cross sections. The resulting high die temperatures may manifest as transient and steady-state mode problems. As an example, temperature spikes due to localized hot spot formation may force a processor chip to temporarily reduce power consumption during a high-performance calculation. Maximum steady-state operating temperature of the processor may require throttling and performance reduction.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
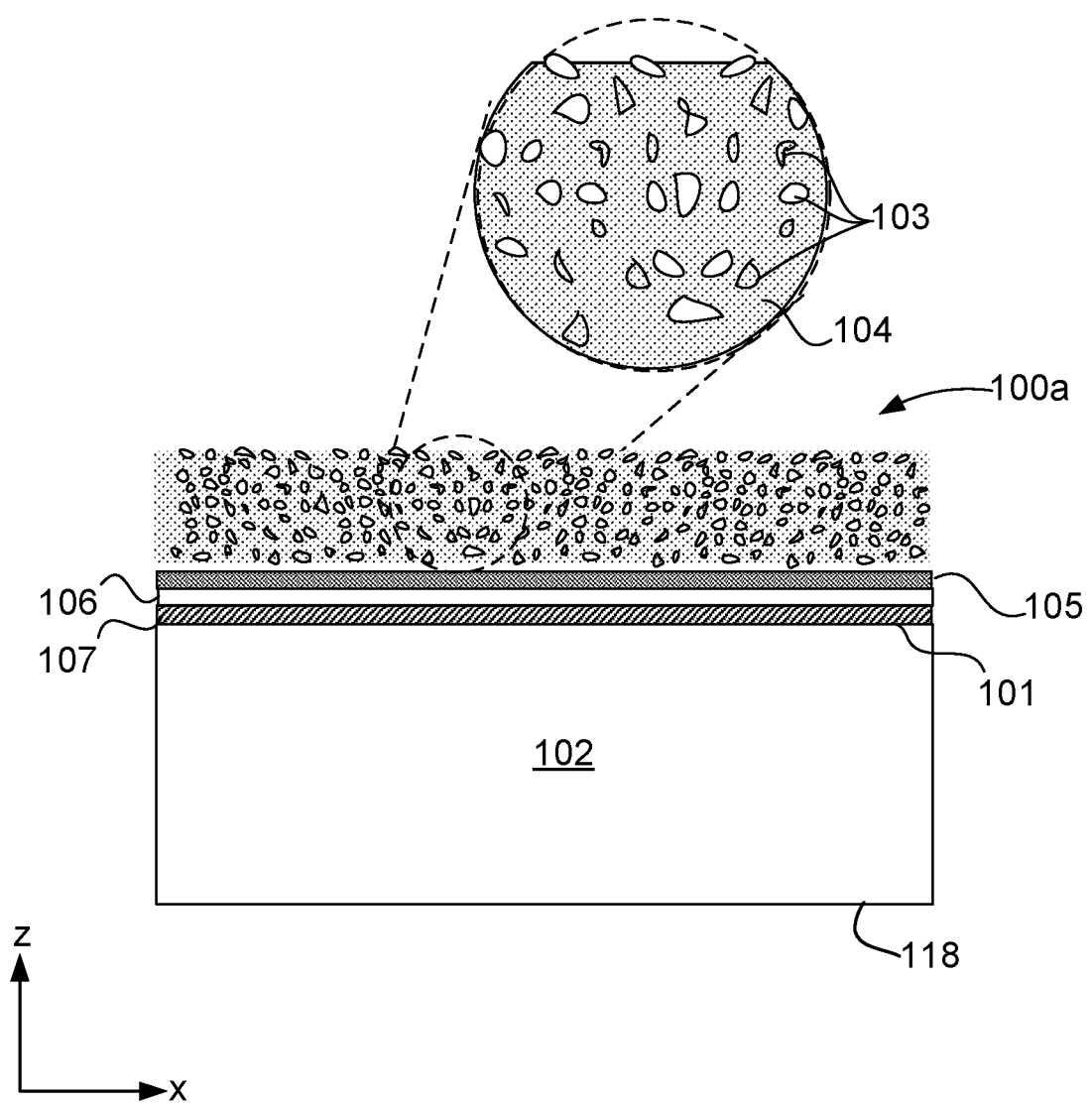
FIG. 1A illustrates a cross-sectional view in the x-z plane of a first embodiment of a hybrid backside thermal structure, according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Here, the term "circuit" or "module" may refer to one or more passive and/or active components that are arranged to cooperate with one another to provide a desired function. The term "signal" may refer to at least one current signal, voltage signal, magnetic signal, or data/clock signal.

The term "microprocessor" generally refers to an integrated circuit (IC) package comprising a central processing unit (CPU), a graphical processing unit (GPU, field-programmable gate array (FPGA) or microcontroller. The microprocessor package is referred to as a "microprocessor" in this disclosure. A microprocessor socket receives the microprocessor and couples it electrically to a printed circuit board (PCB).

The meaning of "a," "an," and "the" include plural references. The meaning of "in" includes "in" and "on." The vertical orientation is in the z-direction and it is understood that recitations of "top", "bottom", "above" "over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

A hybrid backside thermal structure that is integrated directly onto a semiconductor substrate (e.g., the backside of a silicon die) is disclosed. The hybrid backside thermal structure comprises two or more materials, each possessing thermal conductivities ($\kappa$) as high as, or higher than, the thermal conductivity of the semiconductor substrate (e.g., $\kappa$>200 W/m-K at 25° C.), while having unequal linear coefficients of thermal expansion (CTEs). For example, a first material of the hybrid backside structure may have a low coefficient of thermal expansion (e.g., a CTE less than 5 ppm/K, where ppm/K is parts per million expansion per degree Kelvin or Centigrade), approximately matching that of the substrate or less, while the a second material may have a significantly higher coefficient of thermal expansion (e.g., a CTE of 10 ppm/K or greater). The two materials may be segregated in separate domains within the hybrid backside structure. It is noted that unless otherwise indicated, the reference thermal conductivity values cited below for various materials are the thermal conductivities measured at 25° C. CTE values are understood to be valid in the temperature range where the CTE is substantially linear with temperature.

In some embodiments, the hybrid backside thermal structure is a layered structure that comprises two high-$\kappa$ (e.g., $\kappa$>200 W/m-K materials), each having significantly different CTEs, in alternating layers. In alternate embodiments, the hybrid backside structure material is a thick (e.g., thicknesses of 20 micron to 500 microns) layer comprising particles of a low CTE (e.g., CTE of 5 ppm/K or less) material embedded in a matrix comprising a high CTE (e.g., CTE of 5 ppm/K or greater) material. In some embodiments, the matrix may comprise compacted hybrid particles formed by a cold spray or other additive manufacturing process. The matrix may be substantially uniform or multiple lamellar domains may result from particle compaction. In some embodiments, the hybrid structure comprises embedded particles and small lamellar domains of deformed particles ranging in size between 1 and 50 microns, comprising stacks of compressed and distended bi-material particles. In other embodiments, the hybrid structure comprises embedded particles in a uniform matrix. In a uniform matrix, lamellae are not distinguishable, and the matrix has a uniform appearance in low-magnification (e.g., <500×) cross-sections.

The hybrid backside structure may have a thickness ranging between 20 microns to 500 microns. In some embodiments, the disclosed hybrid backside structure may be formed directly on the backside of unsingulated dies during wafer-level processing, or formed on singulated dies before or during package assembly. Alternatively, the disclosed hybrid backside structure may be fabricated separately as a preform structure that is attached to the die backside during package assembly. For example, a preformed hybrid backside structure thermal module comprising alternating layers of two materials may be solder-attached to the backside of unsingulated dies during wafer-level processing, or onto singulated dies before or during package assembly. The hybrid thermal module may have a thickness ranging between 20 microns to 500 microns.

Materials employed in the disclosed hybrid backside structure may advantageously have thermal conductivities significantly higher than the die substrate, improving thermal performance of an IC die of a given thickness that would otherwise have a thermal conductivity limited to that of the substrate semiconductor. In some examples, the material employed in the hybrid backside thermal structure has thermal conductivities $\kappa$<200 W/m-K. This is in contrast to pure silicon, which has a $\kappa$ ranging between approximately 150 W/m-K at 25° C. to approximately 100 W/m-K at 100° C. The high thermal conductivities of the hybrid backside structure may enhance heat transfer away from any localized hot spots within the underlying die. A thickness of at least 20 microns or greater for the hybrid backside structure having a $\kappa$ of at least 200 W/m-K may enable efficient longitudinal and transverse diffusion of heat away from a hot spot within the thin die with which it is in contact, and can better homogenize the temperature distribution and reduce temperature gradients within the die.

Thermal stresses may affect materials within a package in that CTE mismatches between package components may cause die and/or package substrate warpage, possibly damaging the package internally (e.g., breaking solder joints between die and package substrate). Through the inclusion of more than one material, the overall thermomechanical properties (e.g., Young's modulus and coefficient of thermal expansion, CTE) of a hybrid backside thermal structure may be optimized to mitigate stress-induced warpage of an IC die within a package having a particular architecture. Accordingly, the effective CTE of the hybrid backside structure may be engineered by adjusting proportions of a first material having a larger CTE with at least a second material having a lower CTE.

The CTE of the package substrate may be significantly larger than that of the die (e.g., 10-15 ppm/K for FR4 at 25° C., contrasted with 2-3 ppm/K for silicon at 25° C.). The severe mismatch between a silicon die and an organic package substrate (e.g., comprising FR4 material) can cause concave warpage of the die (e.g., backside concave) at high processing temperatures (e.g., those encountered during surface mount operation, or SMT). The effective CTE of the hybrid backside structure may counter the thermal expansion of an organic package substrate to which a die may be bonded. To counter the die warpage, the hybrid backside structure may have a CTE that is approximately the same as or comparable to that of the package substrate, tending to neutralize the warpage. For encapsulated packages, the encapsulation material may cause bowing of the semiconductor die when undergoing thermal expansion as a result of severe CTE mismatch. The addition of a hybrid backside thermal structure may buffer the die from the severe CTE mismatch between die and encapsulation material by having an intermediate CTE, allowing less warpage than would be experienced by the die without the hybrid interface. While homogeneous metallic structures, such as a bonded layer of a phase transition material (e.g., a low-melting metal such as solder), may have a high-$\kappa$ and be bonded to the die backside, such a material typically has a high CTE that may induce die warpage or delamination due to large CTE mismatch with the die semiconductor substrate.

At package level, the disclosed thermal interface structure may be part of a thermal management stack further comprising a thermal interface material (TIM) layer between the die and an integrated heat spreader (IHS). In some embodiments, the TIM is a layer of a thermal grease or paste having a thickness of 20 to 1000 microns between the hybrid backside thermal structure on one side and an IHS on the other side, or between the hybrid backside thermal structure or IHS on one side and a system level cooling solution, such as a heat sink or cold plate coupled to a heat pipe or vapor chamber, on the other side. While the TIM may improve thermal coupling between die and IHS or system level cooling solution, the thermal conductivity of TIM materials may be less than 10 W/m-K, presenting a substantial thermal resistance.

The TIM layer may have a non-negligible thermal resistance as its thermal conductivity may be significantly lower than that of the die and the hybrid backside structure, and presents a thermal impedance to vertical heat transfer between the die and an IHS or system-level cooling solution. As an example, a typical thermal paste has a κ<10 W/m-K, a typical liquid metal TIM has thermal conductivities generally ranging between 15 to 40 W/m-K. As noted above, silicon may have a κ of approximately 100 W/m-K at 100° C. In some implementations, the TIM layer may have a thickness of 150 microns or less. In some embodiments, the hybrid backside structure has raised or stepped regions. A stepped topography may ensure more efficient vertical heat transfer between the die surface and an IHS. For example, thicker portions may be located over portions of the underlying die where hot spots are likely to occur. The hybrid backside structure may comprise tailored topographies, such as multiple tiers having patterned islands on a base layer. The island may have a greater thickness relative to the surrounding base layer. Islands may be located above regions on the underlying die that are prone to hotspots.

In some embodiments, a multichip package (MCP) having dies with different z-heights may be integrated with hybrid backside structures having a different thickness. This package architecture may circumvent the need for a thicker layer of TIM over the thinner die to compensate the differential in die thicknesses.

As an example, a relatively thick TIM layer having a thickness of 100 microns or more may be required to compensate for the differences in die z-height between a short die and a tall die in a MCP. For standard TIM materials having κ of 10 W/m-K or less, a substantial thermal resistance may be created between the die and IHS.

A high-κ hybrid thermal interface structure having a thickness of up to 500 microns may be integrated directly onto the shorter die, increasing its z-height. The thickness of the TIM layer needed to fill any gap between the die and the IHS may be reduced significantly (e.g., 10 microns or less) by the hybrid thermal interface structure. In addition to reducing the thickness of the TIM, low-κ TIM is replaced by a high-structure that can transfer heat more efficiently than the TIM alone. The taller dies in the MCP may also have a hybrid thermal interface integrated to provide more efficient thermal spreading from the hotspots in those dies to the IHS.

In some embodiments, the hybrid backside structure material may be employed as a filler material in MCPs, filling space between adjacent dies. The increased volume of the hybrid backside structure material may enhance heat transfer from the dies by spreading the heat throughout a volume of the package.

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1A illustrates a cross-sectional view in the x-z plane of hybrid backside structure 100a, according to some embodiments of the disclosure.

Hybrid backside structure 100a is shown as a layer of a composite material bonded on backside 101 of substrate die 102 (e.g., a silicon die). Hybrid backside structure 100a may have a thickness ranging between 20 microns (um) and 500 microns, for example. Thicknesses significantly below 20 um will not have a significant impact on the thermals of an IC die. While thicknesses over 500 um are certainly possible, IC die assembly heights or thicknesses should not be ignored. In some embodiments, hybrid backside structure 100a comprises a composite of particles 103 embedded within matrix 104 comprising a ductile and/or malleable material. In some embodiments, particles 103 comprise a brittle or low-ductility material having both a high thermal conductivity κ (e.g., κ>200 W/m-K) and a CTE of 5 ppm/K or less. Examples of suitable materials include, but are not limited to, silicon carbide, aluminum nitride, boron nitride, and diamond. Particles 103 may range in size from 1 to 100 microns. Matrix 104 may comprise a malleable and/or ductile material having a CTE of at least 5 ppm/K. In some embodiments, the material of matrix 104 has a CTE of 10 ppm/K, or greater. Matrix 104 may comprise a material having both a high κ (e.g. κ>200 W/m-K) and a CTE of 10 ppm/K or greater. Examples of suitable materials include, but are not limited to, metals such as copper, aluminum, silver, gold, as well as alloys comprising any of these metals and/or other metals not listed here.

As the hybrid backside structure 100a is advantageously in the significant thickness range denoted above, a high throughput additive manufacturing process such as cold spraying (further described below) is one technique that may be employed in the fabrication of structure 100a. Beyond thickness, one or more other physical attributes indicative of a spray application may be present in structure 100a. For example cold-spraying a blend of particles comprising one of each material may form a hybrid or composite material that includes a malleable/ductile material, as noted above. The ductile material may form a binder for the particles of the other material during layer buildup throughout the spray process.

For layers comprising hybrid backside structure 100a formed by cold spraying, the carrier gas temperature is generally kept below the melting point of any of the constituent solid particles, thus no particle melting occurs. Matrix 104 may be formed by un-melted but malleable/ductile particles bonding to the underlying substrate due to momentum transfer upon impact. High velocity particles exiting the spray nozzle deform and bond upon impact to the underlying substrate or a previously deposited layer of particles. Particles may also deform and elongate into flattened lamellae upon impact, and may build upon each other to form lamellar stacks. Lamellar boundaries may or may not be visible at magnifications less than 500× (e.g., in unprocessed micrographs). Visibility of lamellae in matrix 104 may depend on spray pressure and temperature in cold-sprayed structures, where higher spray pressures and temperatures may cause a high degree of fusion of lamellar boundaries, limiting structural contrast between lamellae (e.g., multiple lamellae appear to be a single structure).

Other thermal spraying techniques that melt particles in flight, such as plasma thermal spraying, may also be employed. In thermal spray, upon impact, some particles that are initially spherical or oval may be in a molten or partially melted state as a result of high-temperature carrier gases (e.g., a plasma jet having a temperature above the melting point of the particle). The molten and partially melted particles (e.g., droplets) may form splats, or flattened discoid structures upon impact on the target surface. The splats may solidify within microseconds of impact, allowing successive layers of splats to build up matrix 104. Particles 103 comprising a non-metallic ceramic or high-melting metal such as tungsten, which may have a melting temperature above the jet temperature, may be embedded within matrix 104, as shown. Built-up layers of splats may form structures resembling lamellar stacks. Boundaries between splats may or may not be easily distinguishable at relatively low magnifications (e.g., <500×). As depicted in the illustrated example of FIG. 1A shown in the inset, distinct boundaries are not visible within matrix 104. In some embodiments, boundaries are visible at low magnifications, as is shown in FIG. 1C, and described below.

In some embodiments, particle adhesion layer 105 may be optionally included on backside 101 directly below hybrid backside structure 100a, for example to improve bonding of matrix 104 to die 102. A metallurgically wettable and/or robust metallic surface layer may improve adhesion of impinging high-velocity particles. Particle adhesion layer 105 may comprise materials, such as, but not limited to, copper, gold, silver, indium, tin, titanium, nickel, vanadium, aluminum, or alloys of any of the afore-mentioned metals and metals not listed here. Particle adhesion layer 105 may have a thickness of 1 micron or less to metallurgically bond particles impinging upon it during a cold spray or other deposition process. In some embodiments, particle adhesion layer 105 may be omitted.

In some embodiments, diffusion barrier 106 may underlie particle adhesion layer 105, or directly underlie hybrid backside structure 100a. Diffusion barrier 106 may comprise materials such as, but not limited to, platinum, palladium, nickel, vanadium, tantalum, tantalum oxide, tantalum nitride, titanium, titanium oxide, titanium nitride, tungsten and chromium. Diffusion barrier 106 may have a thickness of 300 nm or less.

In some embodiments, barrier adhesion layer 107 underlies diffusion barrier 106 (if present) and is directly bonded to die backside 101. Barrier adhesion layer 107 may have a thickness of 10 to 100 nm, and may comprise materials such as, but not limited to, platinum, palladium, nickel, copper, vanadium, tantalum, titanium, tungsten, and chromium. In some embodiments, barrier adhesion layer 107 is optional.

Hybrid backside structure 100a may have an effective CTE that is a function of the combined CTEs of particles 103 and matrix 104. As an example, die 102 may comprise silicon, which has a CTE between 2 and 3 ppm/K. Metallic materials in the hybrid backside structure may have CTEs between 15 and 25 ppm/K. Thermal expansion during heating of the device comprising die 102 may occur during device operation. In particular, hot spots forming due to the operation of integrated circuits on die front side 118 may locally heat die 102, causing large lateral thermal gradients. The effective CTE may be designed to mitigate warpage and/or thermally induced stresses of die 102.

The composite CTE of hybrid backside structure 100a may be a function of the volume fractions of particles 103 and matrix 104. A composite CTE of the structure may be engineered through adjustment of a size and a number density of particles 103 so as to occupy a desired volume fraction of hybrid backside structure 100a.

In some implementations, hybrid backside structure 100a may have an effective CTE engineered to control package warpage. For example, the effective CTE of the hybrid backside structure 100a may be chosen to counteract package warpage caused by a large CTE mismatch between the die 102 and a package substrate material. By possessing an effective CTE that may be close to the CTE of the package material (e.g., FR4 having a CTE of 10-15 ppm/K vs Si having a CTE of 2-3 ppm/K), the overall package warpage may be reduced. In contrast to a homogeneous backside structure (made of one material) whose CTE can't be modified, the CTE of hybrid backside structure 100a may be engineered as described above to meet a certain target that is optimized for a particular package architecture.

Proportions of particles 103 and matrix 104 may be adjusted to produce a composite CTE whose value is between the CTE of particles 103 and the CTE of matrix 104. As an example matrix 104 may comprise a metal, such as copper, having a CTE of approximately 18 ppm/K. Particles 103 may comprise aluminum nitride, having a CTE of approximately 4.5 ppm/K. As noted above, hybrid backside structure 100a may comprise a mixture of particles 103 and matrix 104 that have predetermined proportions (e.g., weight or volume percentage) to produce a composite CTE falling anywhere between those two extremes, depending on the package requirements to minimize warpage and/or stresses.

The large thermal conductivity of hybrid backside structure 100a may also enhance vertical heat transfer to an overhead IHS or system level cooling solution, such as a heat sink or cold plate. Enhanced cooling of die 102 may be afforded by the very high thermal conductivity of hybrid backside structure 100a, surpassing the native thermal conductivity of underlying die 102. As will be described below, hybrid backside structure 100a (and related embodiments) may eliminate or partially replace a conventional thermal interface material (TIM) that has significantly lower thermal conductivity (e.g., <10 W/m-K). Vertical (z-direction) thermal coupling to an IHS or system level cooling solution may be significantly enhanced due to the high thermal conductivity of hybrid backside structure 100a.

Figure 1B:
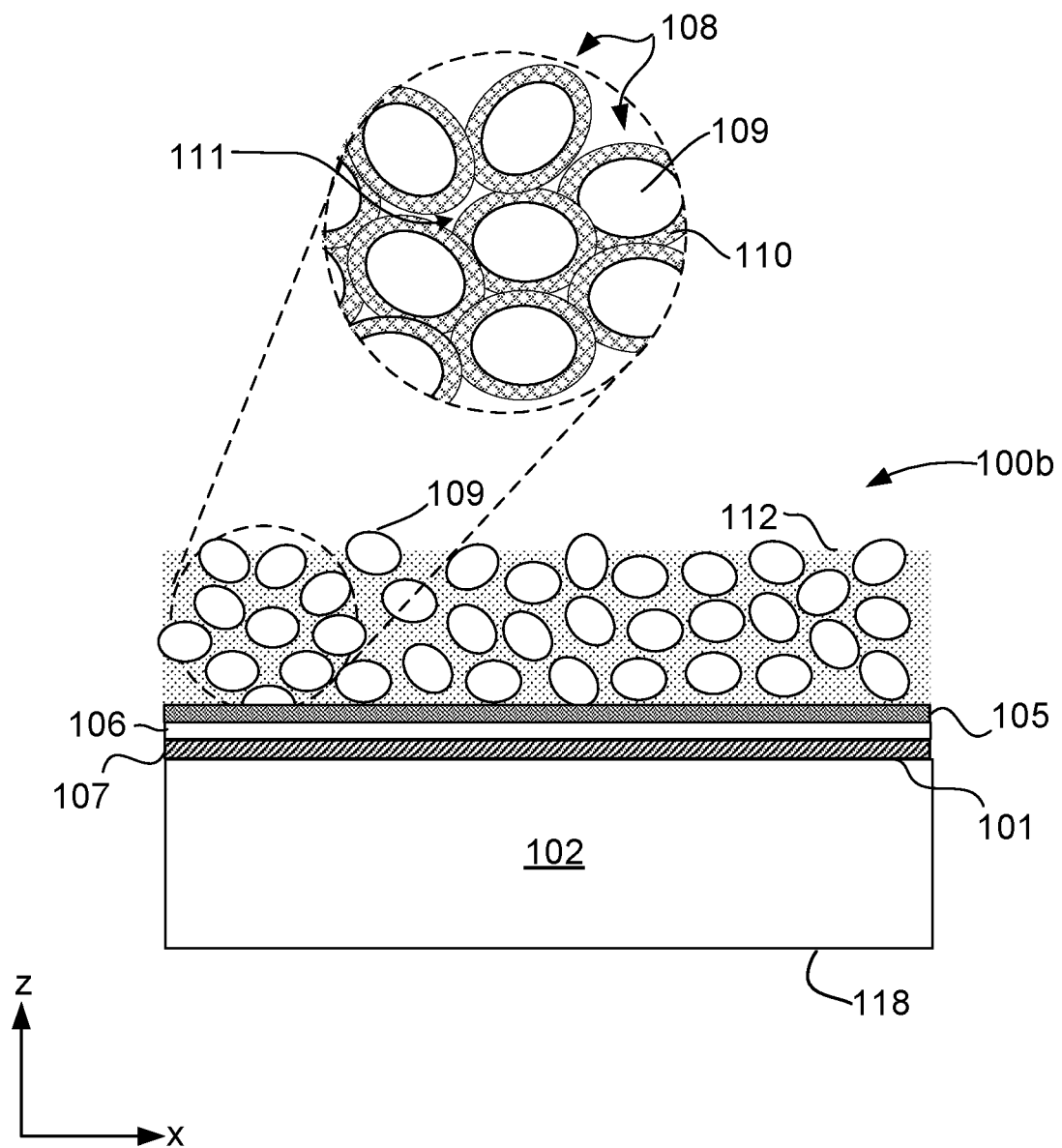
FIG. 1B illustrates a cross-sectional view in the x-z plane of a second embodiment of a hybrid backside thermal structure, according to some embodiments of the disclosure.
Figure 1C:
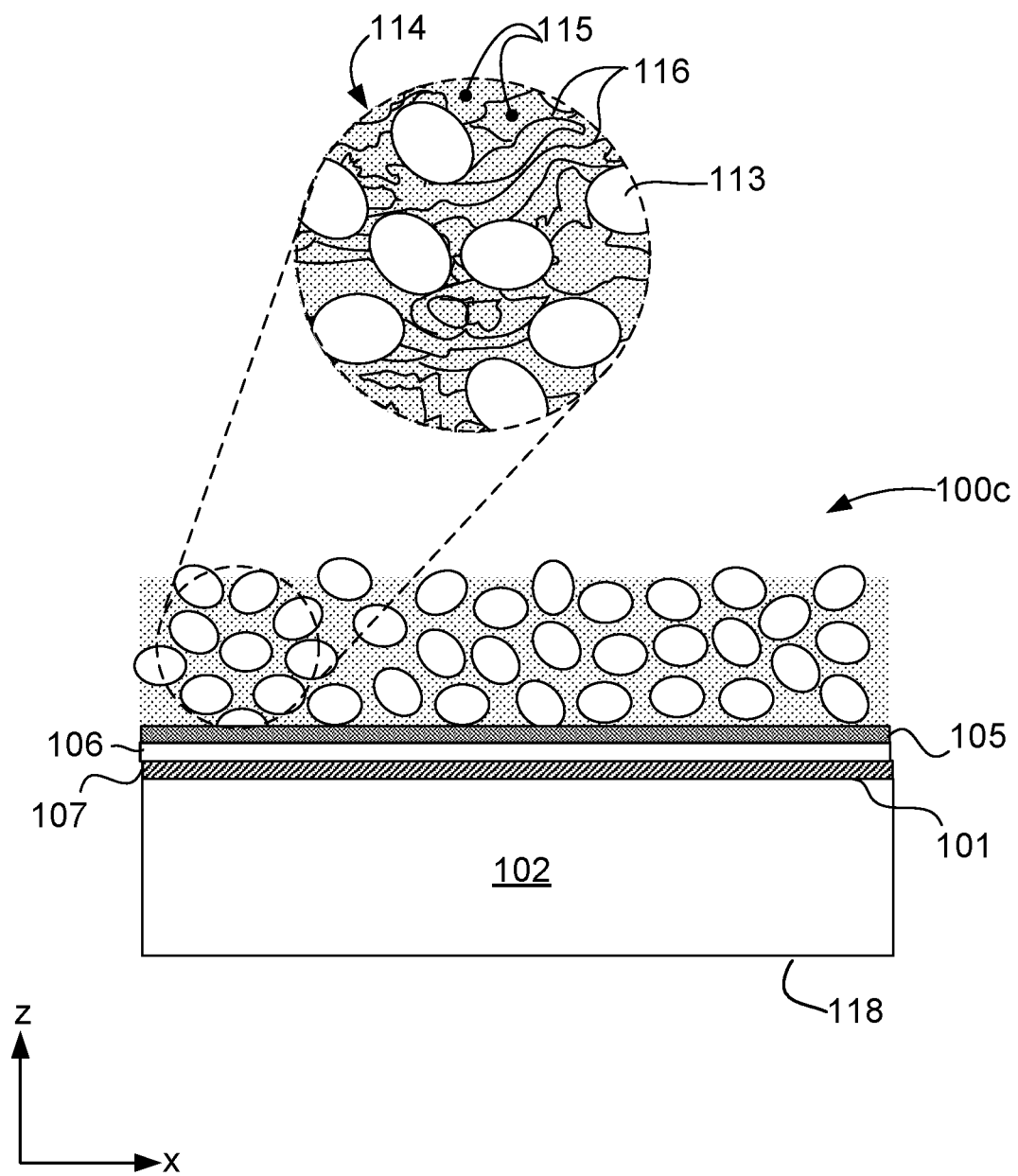
FIG. 1C illustrates a cross-sectional view in the x-z plane of a third embodiment of a hybrid backside structure, according to some embodiments of the disclosure.

FIG. 1B illustrates a cross-sectional view in the x-z plane of hybrid backside structure 100b, according to some embodiments of the disclosure.

Hybrid backside structure 100b is shown as a composite layer bonded onto die backside 101. Hybrid backside structure 100b comprises particles 108 aggregated into a compact layer. Particles 108 comprise particle core 109 ranging in diameter between 5 and 100 microns, and coatings 110 having a thickness ranging between 0.5 and 20 microns surrounding particle core 109. In some embodiments, particle cores 109 comprises a material having a CTE of 5 ppm/K or less surrounded by a metallic coating (e.g. coating 110), having a CTE of at least 5 ppm/K or greater. Hybrid backside structure 100b may be formed by thermal spraying techniques, or by cold spraying of coated particles (described below).

Coatings 110 of individual particles 108 may adhere to one another by metallurgic bonding. Energy transfer due to impact of high momentum particles 108 with the substrate may cause the particles to bond to the underlying substrate or the existing particle layers on the substrate, allowing fusion of adjacent coatings 110 by a similar mechanism to that described above. Furthermore, coatings 110 may be deformed upon impact, having a flattened and elongated appearance, as indicated in the inset of FIG. 1B. Boundaries between adjacent particle coatings 110 may or may not be distinguished at low magnification (e.g., <500×). In the illustrated example shown in the inset of FIG. 1B, boundaries between particle coatings 110 are indicated. Voids 111 may also be present between particles 108 within the layer of hybrid backside structure 100b.

Particle cores 109 may retain a nearly spherical or oval shape after impact, as shown. In some embodiments, particle cores 109 have jagged edges, as may be formed by a grinding process to produce the particles from amorphous (e.g., glasses) or crystalline materials. Particle cores 109 may comprise brittle or low-ductility materials having low CTEs of 5 ppm/K or less and a thermal conductivity κ of 200 W/m-K or greater, such as, but not limited to, silicon carbide, aluminum nitride, boron nitride, and diamond. Coatings 110 may comprise a malleable and/or high-ductility metal having a CTE of 10 ppm/K or greater and a κ of 200 W/m-K or greater, such as, but not restricted to, copper, gold, silver, aluminum, and alloys comprising any of the afore-mentioned metals and other metals not listed here.

Hybrid backside structure 100b may have a thickness ranging between 20 microns and 500 microns. Particle sizes may vary between 5 and 100 microns. Particle cores 109 may vary between 2.5 microns and 95 microns. While the illustration in FIG. 1B shows some particle cores 109 protruding above top surface 112 of hybrid backside structure 100b, in some embodiments, top surface 112 may be substantially planar, having a surface roughness of 1 micron or less.

Similar to the backside structure of FIG. 1A, hybrid backside structure 100b may be bonded to an adhesion layer (e.g., particle adhesion layer 105) bonded on die backside 101. In some embodiments, particle adhesion layer 105 comprises malleable metals such as, but not limited to, copper, gold, silver, indium, tin, titanium, nickel, vanadium, aluminum, or alloys comprising any of the afore-mentioned metals and other metals not listed here. Other characteristics of particle adhesion layer 105 have been described above.

A diffusion barrier (e.g. diffusion barrier 106) and barrier adhesion layer (e.g., joining layer 107) may precede particle adhesion layer 105 in the bonding stack between die backside 101 and hybrid backside structure 100b. Diffusion barrier 106 and barrier adhesion layer 107 have been described above.

FIG. 1C illustrates a cross-sectional view in the x-z plane of hybrid backside structure 100c, according to some embodiments of the disclosure.

Hybrid backside structure 100c is shown as a composite layer bonded onto die backside 101. Similar to the structure of hybrid backside structure 100a shown in FIG. 1A, hybrid backside structure 100c comprises particles 113 embedded within matrix 114. In the illustrated embodiment, matrix 114 comprises irregular lamellae 115 having discernable boundaries 116. As noted above, lamellae 115 may be formed by splats of molten or partially melted particles deposited over die backside 101 by a thermal spray process. Alternatively, lamellae may be formed in a cold spray process (gas temperatures generally below 800° C.) by compacted and plastically deformed particles comprising a ductile/malleable material.

In some embodiments, a bonding stack comprising particle adhesion layer 105, diffusion barrier 106 and barrier adhesion layer 107 is between die 102 and hybrid backside structure 100c. Structural details of the bonding stack are described above.

Figure 2:
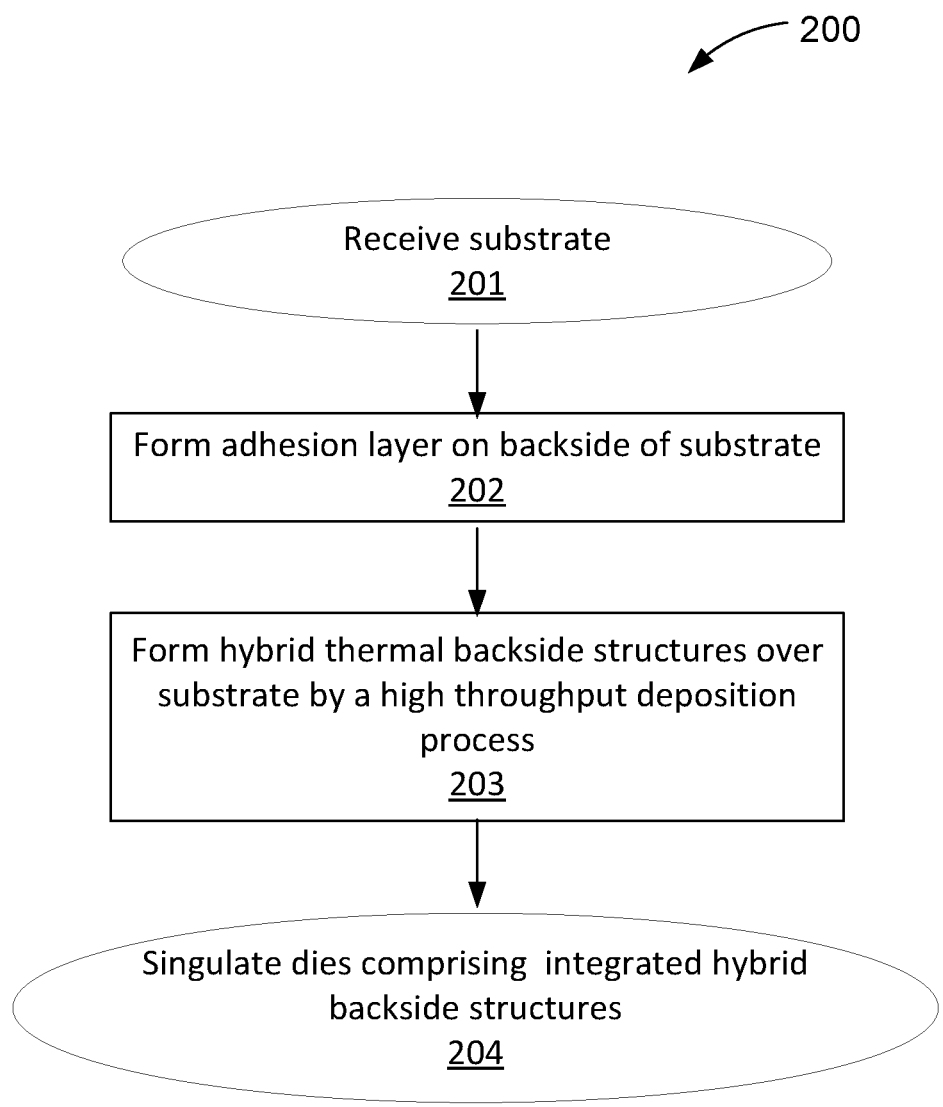
FIG. 2 shows a process flow chart summarizing an exemplary method, illustrated in FIGS. 3A-3H, for forming a hybrid backside structure, according to some embodiments of the disclosure.

FIG. 2 shows a process flow chart 200 summarizing an exemplary method illustrated in FIGS. 3A-3H for forming one of hybrid backside structures 100a-100c, according to some embodiments of the disclosure.

At operation 201, a substrate is received into a die fabrication process. The substrate may be a wafer comprising semiconductor (e.g., silicon, germanium, silicon-germanium, gallium arsenide or gallium nitride). In some embodiments, multiple integrated circuits have been fabricated in a device layer on the front side of the wafer. The integrated circuits may be distributed on multiple singulated dies (e.g., dies 102) cut from the wafer in subsequent operations.

At operation 202, adhesion and barrier layers may be deposited on the backside of the wafer. A barrier layer may be necessary to protect the wafer from any diffusion of metal into the bulk during deposition of the hybrid backside structure in a subsequent operation. The barrier layer may comprise platinum, palladium, nickel, vanadium, tantalum, tantalum oxide, tantalum nitride, titanium, titanium oxide, titanium nitride, tungsten or chromium, and may be deposited, for example, by a rf sputter process, to a thickness of 100 nm or less. A thin-film (e.g., 50 nm or less) adhesion layer may precede the barrier layer to bond the barrier layer to the semiconductor surface. A particle adhesion layer may be deposited over the barrier layer and may include copper, gold, silver, indium, tin, titanium, nickel, vanadium, aluminum or alloys containing the afore-mentioned metals. The adhesion layer may have a thickness of 1 micron or less. The adhesion layer may provide a metallurgically wettable surface to enable adhesion of particles that may form the hybrid backside structure.

At operation 203, the hybrid backside structure is deposited by a high throughput deposition process such as cold spray, as described in more detail below. Particles comprising the materials employed in the hybrid backside structure are entrained in a gas jet that is directed to a substrate, causing the particles to impinge on the substrate at high velocity. The particles carry two materials that are employed in the hybrid backside structure (e.g., hybrid backside structure 100a). As noted above, a first material is malleable and/or ductile, having a CTE of at least 10 ppm/K. The second material is more brittle than the first material, having a CTE of 5 ppm/K or less. The two materials may be carried to the substrate by two different particles, one comprising the low CTE material, generally a non-metal, and the second comprising the high CTE material, generally a metal. Alternatively, the two materials may be carried by a single particle having a core of the low CTE material surrounded by a coating of the high CTE material.

Above a threshold velocity, particles comprising the malleable/ductile material plastically deform upon impact, forming flattened and elongated or oblong structures (e.g., splats). The splats may adhere to the substrate and subsequently to each other as layers of the hybrid backside structure are grown. The more brittle material may embed as distinct particles within a matrix formed by the high CTE malleable/ductile material. Growth of the hybrid backside structure over a typical die area (e.g. approximately 20 mm×20 mm) by a cold spray process may take place at a rate of 20-100 microns/second.

In some embodiments, the hybrid backside structure is deposited in multiple layers. A first layer may be grown to a first specified thickness. A second layer may be grown to a second specified thickness over the first layer by cold spraying through a shadow mask, forming a pattern of islands or other structures over a base layer. The islands may be stepped regions of the hybrid backside structure having a double thickness, for example.

At operation 204, the hybrid backside structure growth on the backside of the substrate is complete. The thickness of the coating comprising the hybrid backside structure may range between 20 microns and 500 microns. As noted above, the hybrid backside structure may comprise multiple layers.

The upper layers may be patterned into islands, providing regions of greater thickness of the hybrid backside structure over the substrate. For example, stepped regions of the hybrid backside structure may cover areas of the underlying die where hot spots are likely to occur during device operation.

The substrate may be singulated into individual dies, each having the hybrid structure on its backside. When mounted in a package, the hybrid backside structure may be used to replace a conventional TIM (e.g. in MCPs with different die heights as described above) and provide better thermal coupling with an IHS or system-level cooling solution. The CTE of the hybrid backside structure may be engineered to mitigate package warpage or thermal stresses within the die and/or package.

FIGS. 3A-3H illustrate cross-sectional views in the x-z plane of an exemplary process for making hybrid backside structure 100a, according to some embodiments of the disclosure.

Figure 3A:
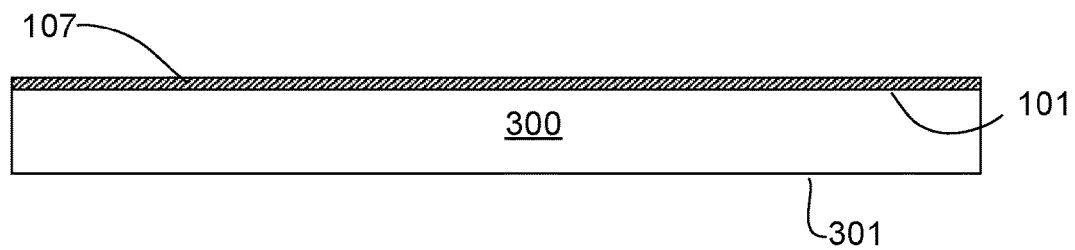
FIGS. 3A-3H illustrate cross-sectional views in the x-z plane of an exemplary process for making a hybrid backside structure, according to some embodiments of the disclosure.

In FIG. 3A, a substrate 102 comprising a semiconductor (e.g., silicon, silicon germanium, germanium, gallium nitride, indium arsenide or gallium arsenide), shown inverted with backside 101 above die front side 301, is received in a back-end-of-line process operation. Die front side 301 may comprise integrated circuitry. Substrate 102 may be a wafer having a plurality of unsingulated dies that may have been processed to the level of complete formation of integrated circuitry (not shown) on die front side 301. In alternative embodiments, substrate 102 may be a singulated die that is supported on a carrier substrate (not shown) in a pre-packaging operation, or received into a package assembly line and bonded to a package substrate (not shown).

In the illustrated embodiment, joining layer 107 has been deposited on die backside 101. Joining layer 107 may comprise low-melting metals such as, but not limited to, platinum, palladium, nickel, copper, vanadium, tantalum, titanium, tungsten, and chromium, or alloys comprising any of the aforementioned metals and metals that are not listed here. Joining layer 107 may be formed by deposition of a solder paste on die backside 101 followed by a reflow process. Alternatively, joining layer may be formed by metal chemical vapor deposition. In some embodiments, joining layer 107 comprises a silver-filled epoxy. Joining layer 107 may be formed to a thickness of 0.01-5 microns. A thin inorganic or metallic film may be deposited over the bare semiconductor surface on die backside 101 to aid in metallurgical adhesion of joining layer 107 to the bare semiconductor. In some embodiments, joining layer 107 is optional, and may be omitted.

Figure 3B:
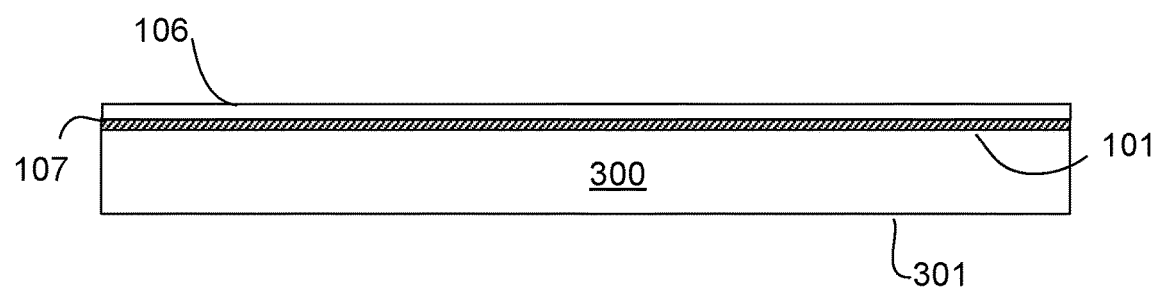

In FIG. 3B, barrier layer 106 is deposited over barrier adhesion layer 107 or directly over die backside 101. In the illustrated embodiment, adhesion layer 107 is deposited as shown in FIG. 3A, and intervenes between barrier layer 106 and die backside 101 to promote adhesion of barrier layer 106 to die backside 101. Barrier layer 106 may be formed by a suitable method for thin-film deposition of materials such as, but not limited to, platinum, palladium, nickel, vanadium, tantalum, tantalum oxide, tantalum nitride, titanium, titanium oxide, titanium nitride, tungsten and chromium. The afore-mentioned materials may be deposited using, for example, DC or RF sputtering, evaporation or metal chemical vapor deposition, in layers up to 1-300 nm thick. In some embodiments, barrier layer 106 is optional.

Figure 3C:
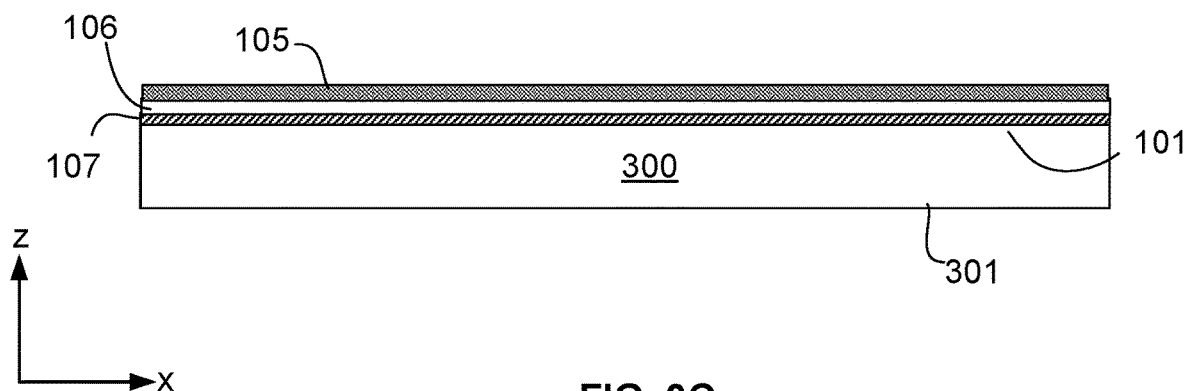

In FIG. 3C, particle adhesion layer 105 is deposited over diffusion barrier layer 106. In some embodiments, barrier layer 106 and/or barrier adhesion layer 107 is/are omitted, and adhesion layer is deposited directly on die backside 101. Particle adhesion layer 105 may comprise materials, such as, but not limited to, copper, gold, silver, indium, tin, titanium, nickel, vanadium, aluminum, or alloys of any of the afore-mentioned metals and metals not listed here. Particle adhesion layer 105 may enhance or enable adhesion of the hybrid backside structure layer (e.g., hybrid backside structure 100a) in the incipient stages of its formation by impinging high-velocity particles in a cold or thermal spraying process, described below. Accordingly, particle adhesion layer 105 may be deposited or formed to a thickness between 0.1 and 5 microns to intercept and bond to the high-energy particles without being eroded itself by the impinging particles. Particle adhesion layer 105 may provide a metallurgically wettable surface as well to enable adhesion of molten or partially melted metallic particles that may form a metallic matrix (e.g., matrix 104 in FIGS. 1A-1C) during thermal spraying processes.

Figure 3D:
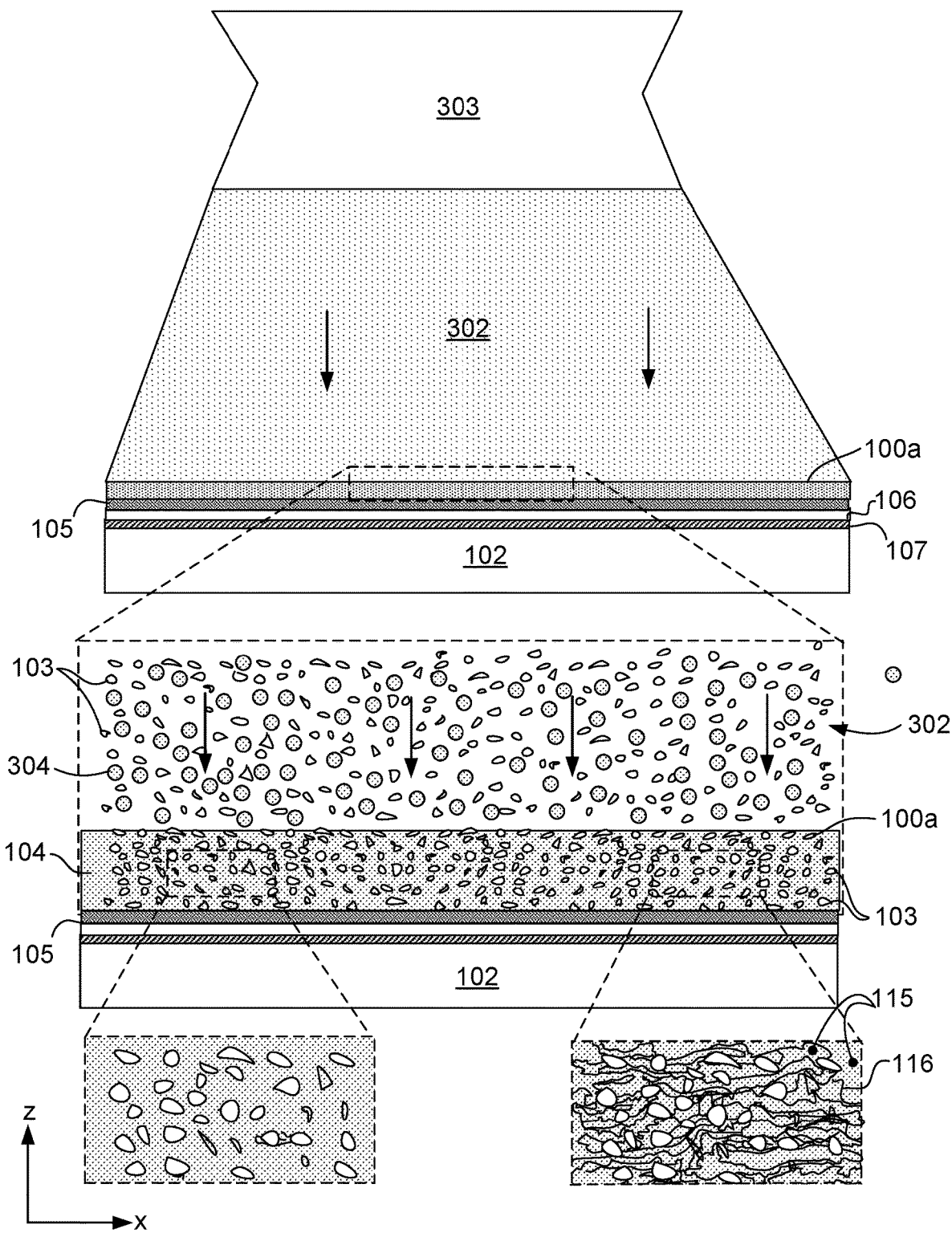

In FIG. 3D, formation of hybrid backside structure 100a is shown in process. The illustrated embodiment depicts a cold spray process to form a composite coating layer comprising particles 103 embedded in matrix 104, as described above. Cold spray jet 302 is directed towards die 102 from nozzle 303, as indicated by the downward-pointing arrows. In some embodiments, spray jet 302 comprises helium, nitrogen, or air, in addition to solid particles introduced in the form of powders as described in more detail below.

In the illustrated embodiment, a cold spray process is employed to form hybrid backside structure 100a from a spray jet 302 comprising a carrier gas (such as helium, nitrogen, or air) and solid particles 103 and 304. As an example, particles 103 comprise a brittle material having a CTE of 5 ppm/K or less, and a κ of 200 W/m-K or greater. Particles 304 may comprise a malleable/ductile material having a CTE of 10 ppm/K or greater and κ<200 W/m-K. Examples of suitable brittle and ductile materials have been given above.

Spray jet 302 may comprise nitrogen, air or helium heated to temperatures between approximately 500° C. and 800° C. Because the gas temperatures are relatively low, particles 103 and 304 may be entrained in solid form in spray jet 302. Gases may be expanded from upstream pressures above 2 MPa (e.g., above 20 atmospheres) inside nozzle 303 to atmospheric pressure upon exiting the nozzle, causing entrained particles to reach high velocities (e.g., greater than 400-500 m/s). The spray process conditions may be adjusted to achieve particle velocities equal to or exceeding a critical velocity for bonding and adhering to a substrate (e.g., particle adhesion layer 105 on die backside 101) or to each other in the top layer of the coating formed by build-up of sprayed particles on a substrate. Pressurized gases may be preheated upstream of nozzle 303 to increase the overall energy of the jet.

In some embodiments, free particles 304 are spherical or oval shaped as shown in the expanded view in FIG. 3D. While particles 304 are depicted as smooth, spherical particles, they may have any shape, including angular and jagged shapes. Particles 304 may range in diameter between 1 and 100 microns. In some embodiments, particles 304 comprise a ductile material that may plastically deform upon impact, forming flattened and elongated structures that may have approximate lengths between 5 and 500 microns. The energy transfer may cause local heating at the point of impact. Continuous particle impact upon the top surface of the growing cold-spray coating may build up matrix 104 as stacks of lamellae formed by the flattened particles adhering to each other. The lamellar stacks may appear as contiguous irregular or regular-shaped lamellae 115 (shown in cross-section within the inset at the bottom of the figure). In some embodiments, lamellae 115 are delineated by boundaries 116, seen at magnifications below 500×. In some embodiments, lamellae 115 are not distinguishable at the indicated magnifications. Non-distinguishable lamellae are indicated by the lack of lamellar boundaries in the expanded view of matrix 104.

While in the illustrated embodiment particles 103 are shown to have jagged and angular shapes, particles 103 may be smooth, having near spherical or oval shapes. Sizes of particles 103 may range between 1 and 100 microns. Particles 103 may comprise a brittle material (as described above) that does not plastically deform upon impact, however may fracture. Particles 103 may simply embed between or within lamellae of matrix 104. In some embodiments, particles 103 comprising materials such as tungsten have low ductility (e.g., lower than that of particles 304) yet have a low CTE (<5 ppm/K). Such particles may plastically deform upon impact, also forming lamellar structures and not distinct particles that embed within matrix 104.

Figure 3E:
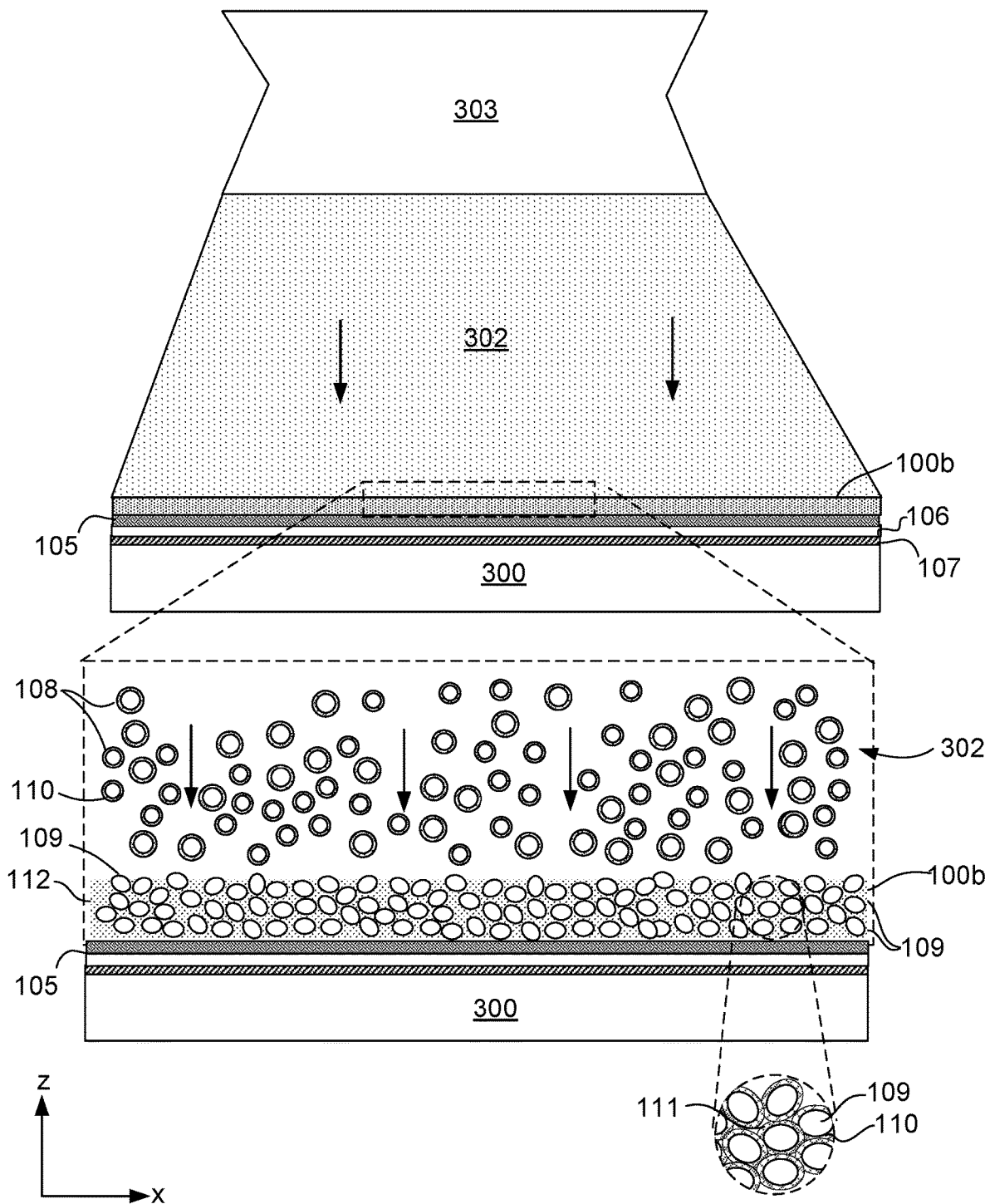

In FIG. 3E, hybrid backside structure 100b is formed in a cold spray process similar to that shown in FIG. 3D. Contrasting the process depicted in FIG. 3D, a single particle type is entrained in cold spray jet 302. Particles 108 may have a binary composition, for example having a core 109 comprising a first material encased in coating 110 comprising a second material. In the illustrated embodiment, core 109 may comprise a material having a CTE of 5 ppm/K or less, whereas coating 110 may comprise a malleable/ductile material having a CTE of 10 ppm/K or greater. Both materials may have a κ of 200 W/m-K or greater.

The cold spray process depicted in FIG. 3E deposits particles 108 into a coating that is to develop into hybrid backside structure 100b. Cold spraying may develop coatings at a rapid rate in comparison to other layer deposition methods (e.g., chemical vapor deposition). For example, over a typical die area (e.g. approximately 20 mm×20 mm) some coatings may be formed at a rate of 20-100 microns per second. In a manner similar to that of formation of matrix 104 shown in FIG. 3D, matrix 112 may be formed by fusion of coatings 110 of particles 108 impinging on the developing hybrid structure 100b. Coatings 110 may deform plastically upon impact because of their ductility, while cores 109 may remain largely unchanged upon impact of particles 108. Cores 109 may comprise a brittle or low-ductility material, as noted above. As shown in the inset, matrix 112 may comprise a network of coatings 110 encasing cores 109, where coatings 110 are fused together. In some embodiments, voids 111 are present within matrix 112.

Figure 3F:
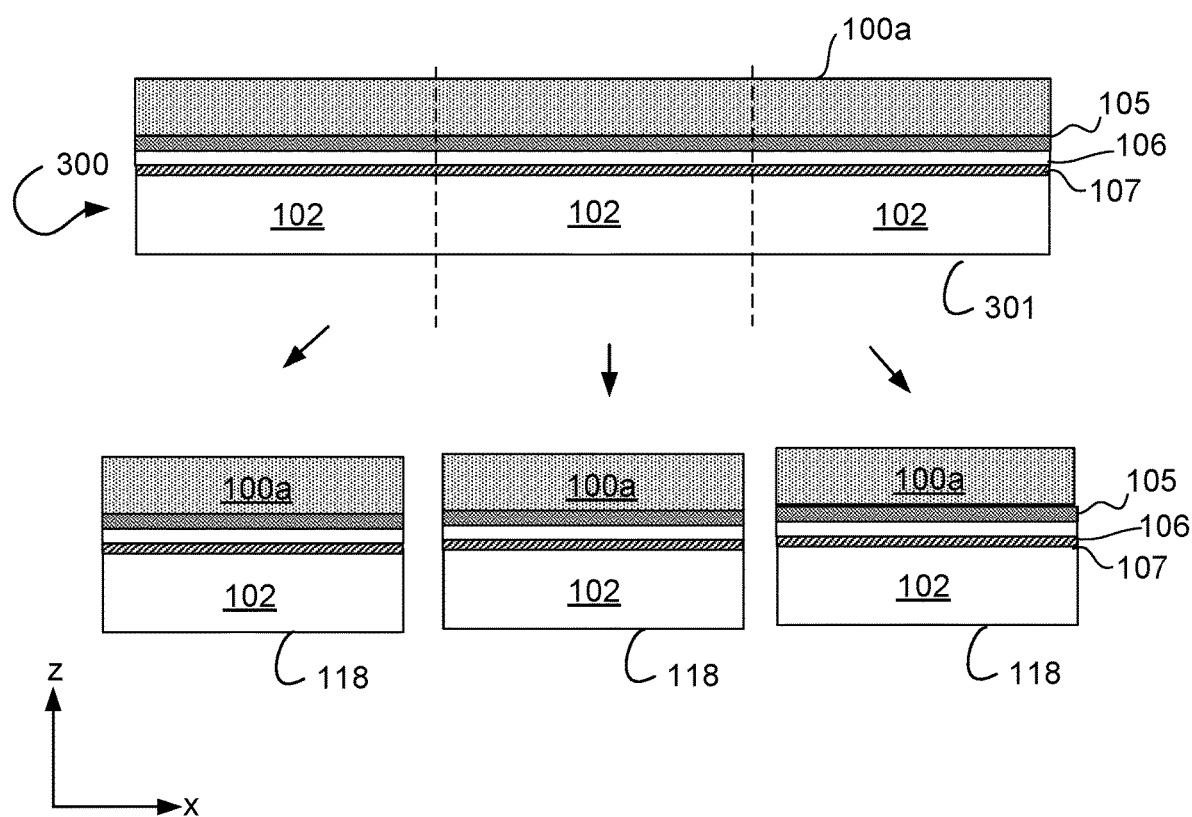

In FIG. 3F, substrate 300 is singulated into individual dies 102 having integrated thermal hybrid layers 100a. In some embodiments, dies 102 are singulated from substrate 300 and assembled into a package before hybrid backside structure 100a is formed. Hybrid backside structure 100a may be formed on assembled die 102 in-situ.

Figure 3G:
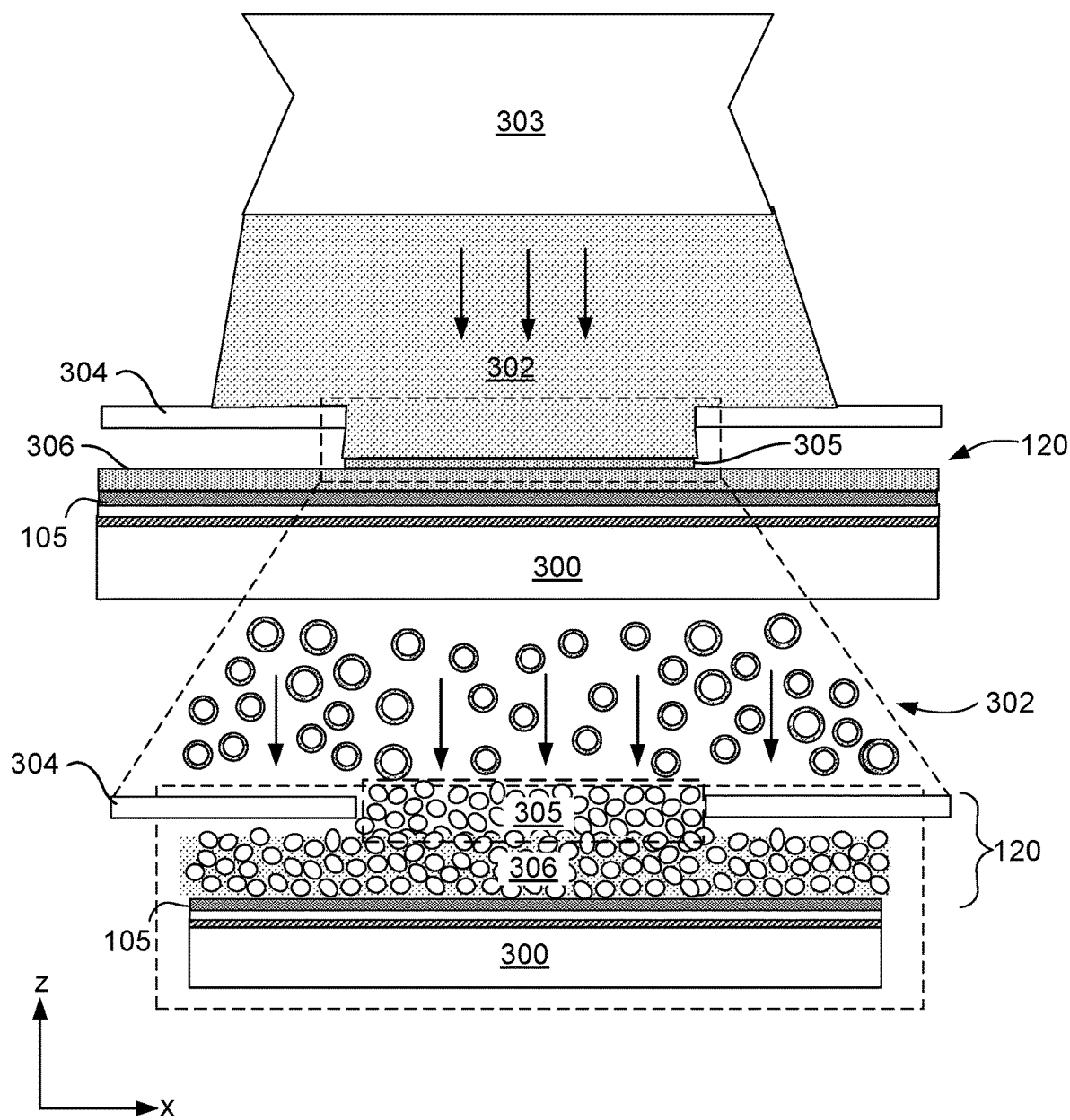

In FIG. 3G, mask 304 is employed to form a patterned layer over hybrid backside structure 100b, forming islands 305 over base layer 306. Islands 305 may extend over a partial length of base layer 306, forming a stepped portion of hybrid backside structure 120. The mask may have openings that are 100 microns or larger to pattern islands having the approximate dimensions of the mask openings. Island 305 may have any suitable shape to cover selected regions of the substrate, and may be grown to any specified thickness. Island 305 may provide additional thickness of hybrid backside structure 120 over portions of the substrate 300 (e.g., as a singulated die 102) susceptible to hot spots during device operation. While two layers are shown for hybrid backside structure 120, any suitable number of layers may be employed.

Figure 3H:
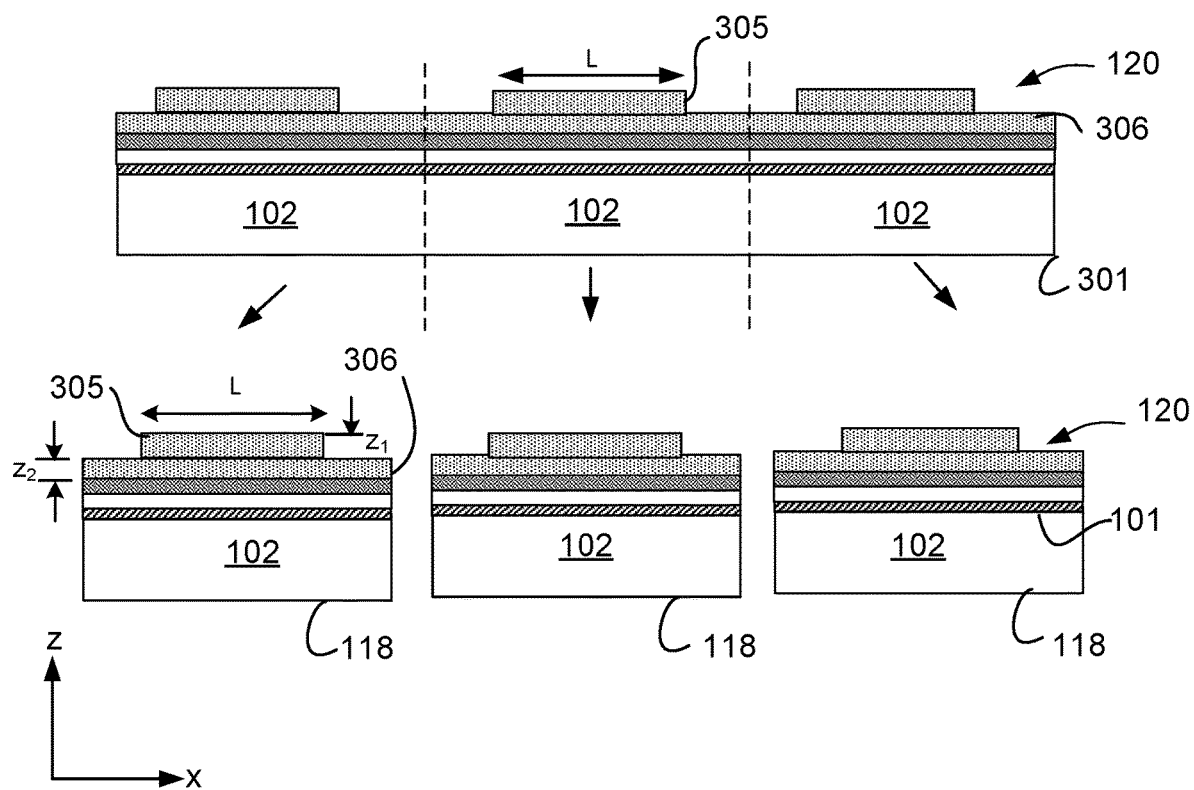

In FIG. 3H, substrate 300 is singulated into individual dies 102, each having hybrid backside structure 120 integrated on die backside 101. In the illustrated embodiment, hybrid backside structure 120 comprises islands 305 having length L and thickness $z_1$ over base layer 306, having a thickness $z_2$. In some embodiments, the sum of $z_1$ and $z_2$ may be between 20 um and 500 um. Base layer 306 may cover the entire die backside 101.

Figure 4:
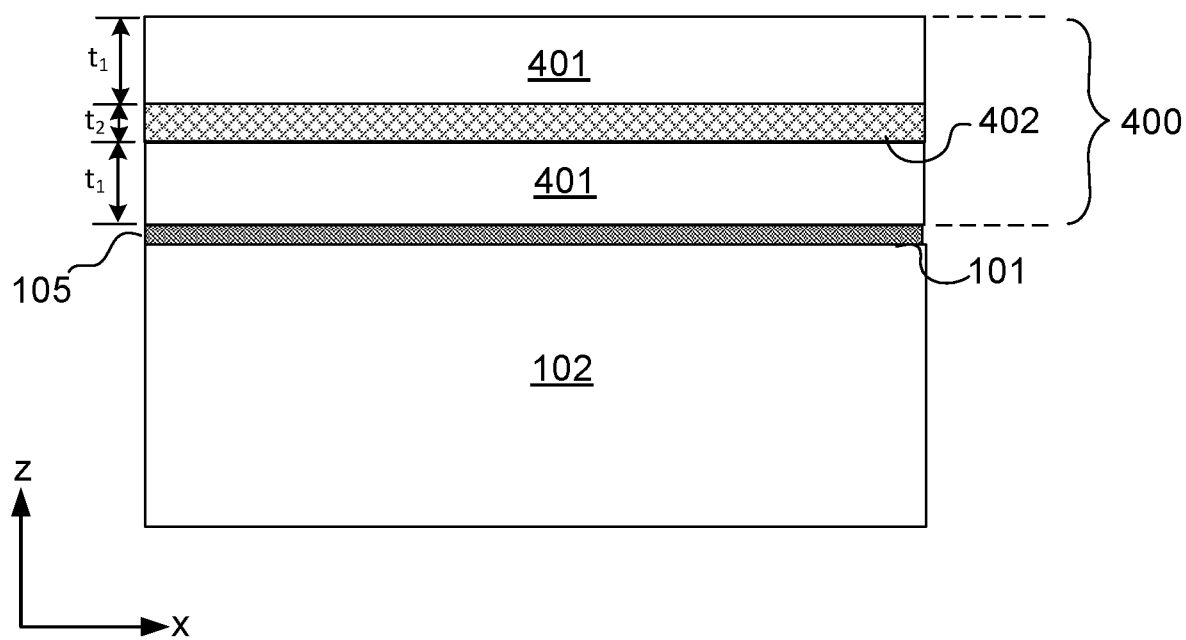
FIG. 4 illustrates a cross-sectional view in the x-z plane of hybrid backside structure having alternating layers of a low CTE material and a high CTE material, according to some embodiments of the disclosure.

FIG. 4 illustrates a cross-sectional view in the x-z plane of hybrid backside structure 400, having alternating layers of a low CTE material and a high CTE material, according to some embodiments of the disclosure.

Hybrid backside structure 400 comprises alternating layers 401 and 402 on die backside 101. Layers 401 may comprise a material having a CTE of 10 ppm/K or greater and a κ of 200 W/m-K or greater. Suitable materials having these characteristics have been described above. Layers 401 may have a thickness $t_1$ ranging between 1 and 50 microns. Layers 402 may be interleaved between layers 401. Layer thicknesses $t_1$ and $t_2$ may be adjusted for a desired stiffness. Layer 402 may comprise a material having a CTE of 5 ppm/k or less and a κ of 200 W/m-K or greater. While layer 402 may have a thickness $t_2$ ranging between 1 and 50 microns, layers 401 may have a larger thickness than layers 402 or vice versa.

Hybrid backside structure 400 may be formed in-situ on die 102, or attached to die 102 as a separately fabricated module that is integrated onto die backside 101 in a pre-packaging operation or during package assembly. Hybrid backside structure 400 may have a total thickness ranging between 20 and 500 microns. Joining layer 105 may be optionally included between die backside 101 and hybrid backside structure 400. Joining layer 105 may facilitate attachment of hybrid backside structure 400 that is fabricated as a separate component. Joining layer 105 may have a high thermal conductivity, and comprise a solder or solder-like material (e.g., comprising materials such as, but not limited to, copper, silver, tin, indium and gallium). Joining layer 105 may have a thickness of 0.1 to 5 microns.

Alternating layers of high and low-CTE materials may enable precision engineering of composite CTE by adjustment of layer thicknesses and choice of materials. While three layers are shown in the illustrated embodiment, any suitable number of layers may be employed to achieve a composite CTE.

Figure 5:
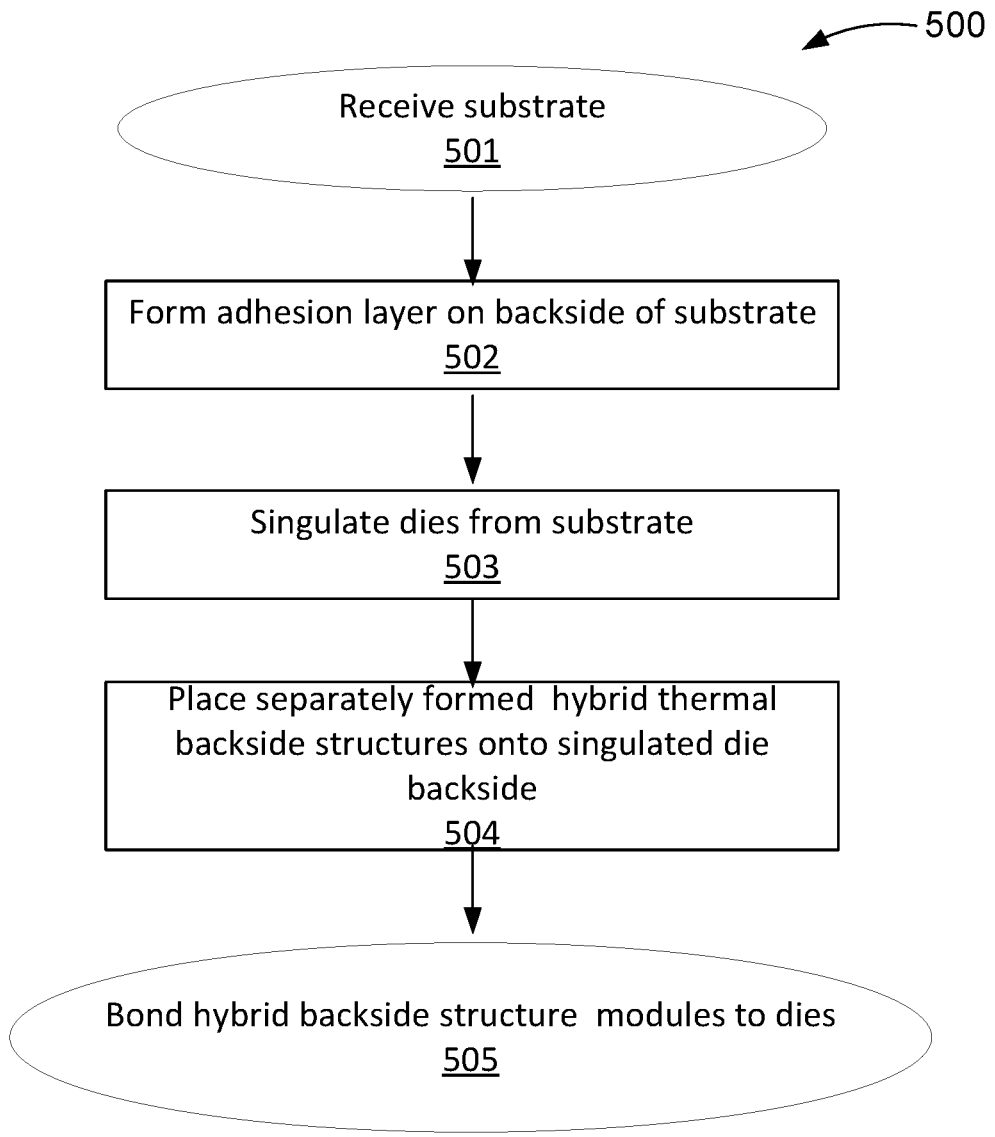
FIG. 5 shows a process flow chart 500 summarizing an exemplary method illustrated in FIGS. 6A-6E for attaching a hybrid backside structure to a die, according to some embodiments of the disclosure.

FIG. 5 shows process flow chart 500, summarizing an exemplary method illustrated in FIGS. 6A-6E for attaching a hybrid backside structure module 400 to die 102, according to some embodiments of the disclosure.

At operation 501, a substrate is received into a die fabrication process. The substrate may be a wafer comprising a (e.g., silicon, germanium, silicon-germanium, gallium arsenide or gallium nitride). In some embodiments, multiple integrated circuits have been fabricated on one side (e.g., the front side) of the wafer. The integrated circuits may be distributed on multiple singulated dies (e.g., dies 102) cut from the wafer in subsequent operations.

At operation 502, an adhesion layer (e.g., particle adhesion layer 105) is formed over the backside (e.g., side opposite the integrated circuitry) of the substrate. The adhesion layer may be a metal or solder layer or an organic layer.

At operation 503, dies (e.g., dies 102) are singulated from the substrate. In some embodiments, the singulated dies are assembled into packages by bonding to a package substrate.

At operations 504 and 505, stand-alone hybrid backside structure modules 400 are placed on the backsides of the singulated dies as a package component by a pick-and-place operation during package assembly. In alternate embodiments, hybrid backside structure modules 400 may be attached to dies at wafer level, in a pre-singulation operation.

Hybrid backside structure modules 400 may be attached to singulated dies, or unsingulated dies by reflowing the adhesion layer deposited as a solder layer in operation 502. In some embodiments, the adhesion layer comprises an organic epoxy resin, which may be deposited immediately before attachment of hybrid backside structure modules 400 onto the dies and then cured during the attachment process.

FIGS. 6A-6E illustrate cross-sectional views in the x-z plane of an exemplary method for attachment of hybrid backside structure module 400 to die 604, according to some embodiments of the disclosure.

Figure 6A:
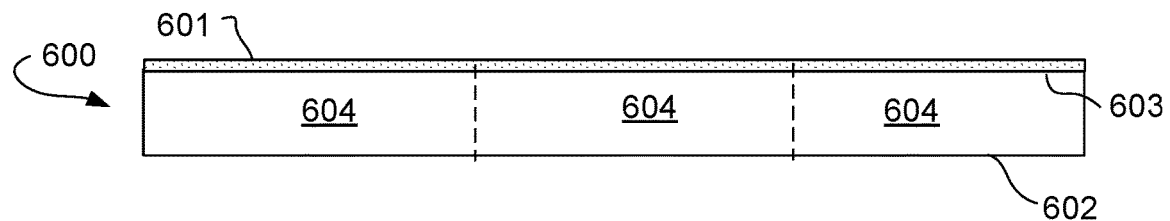
FIGS. 6A-6E illustrate cross-sectional views in the x-z plane of an exemplary method for attachment of a hybrid backside structure module to a die, according to some embodiments of the disclosure.

In some embodiments, hybrid backside structure 400 is formed as a separate packaging component to be attached to a die, for example during package assembly. In FIG. 6A, a substrate 600 is received into a back-end-of-line process. Substrate 600 may be a processed or unprocessed semiconductor wafer. In the illustrated embodiment, substrate 600 is a semiconductor wafer having a plurality of unsingulated dies 604. Substrate 600 comprises integrated circuitry 601 on substrate front side 603, opposite backside 602.

Figure 6B:
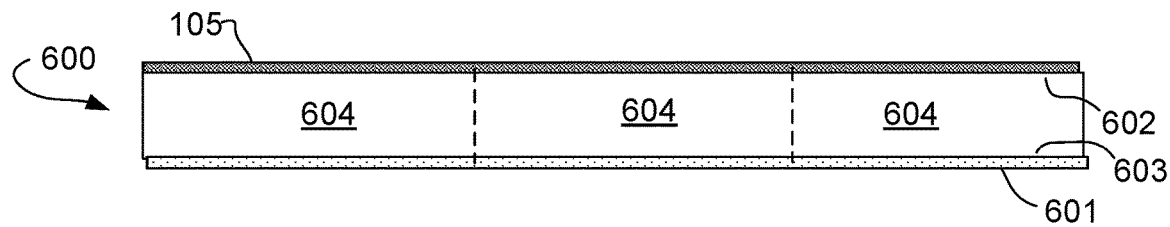

In FIG. 6B, joining layer 105 has been deposited over substrate (wafer) backside 602. Joining layer may be a solder or solder-like layer, comprising metals such as, but not limited to, copper, tin, silver, indium, gallium, or alloys of the afore-mentioned metals with each other or with metals not listed here. The afore-mentioned materials may be deposited as a solder paste followed by a reflow. In some embodiments, joining layer 105 comprises a silver- or carbon-epoxy composite. Joining layer 105 may have a thickness ranging between 0.1 and 5 microns. While the illustrated process operation shows formation of joining layer 105 at wafer level, in some embodiments, joining layer 105 may be formed on backside 602 of each separate die 604 after singulation of dies 604 from substrate 600.

Figure 6C:
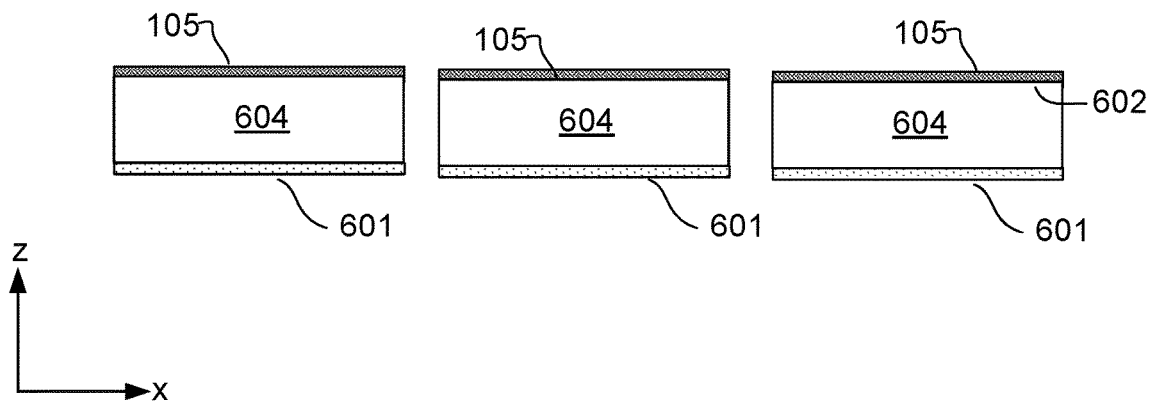

In FIG. 6C, dies 604 are singulated from substrate 600. Singulated dies 604 may be attached to package substrates during package assembly. As already noted, joining layer 105 may be deposited on backsides 602 of singulated dies 604 previously assembled into packages, instead of depositing the adjoining layer on substrate 600 as shown in FIG. 6B. Alternatively, singulation is postponed until after attachment of stand-alone hybrid backside structures 400 to unsingulated dies on the wafer.

Figure 6D:
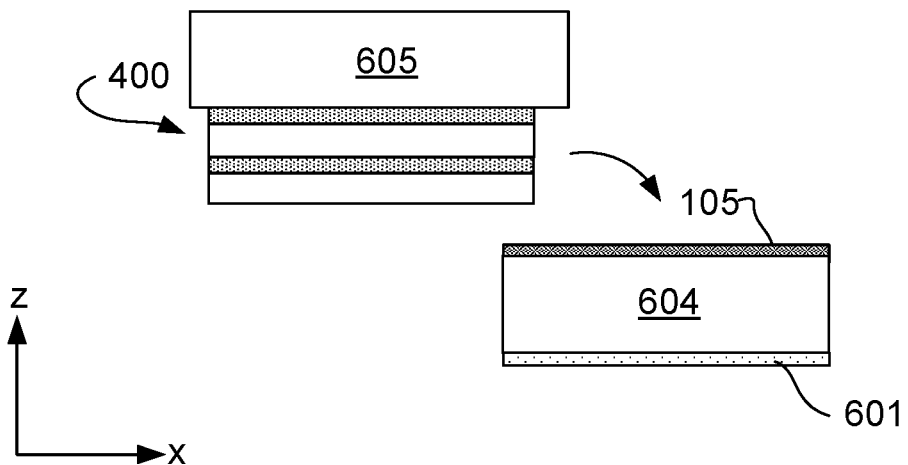
Figure 6E:
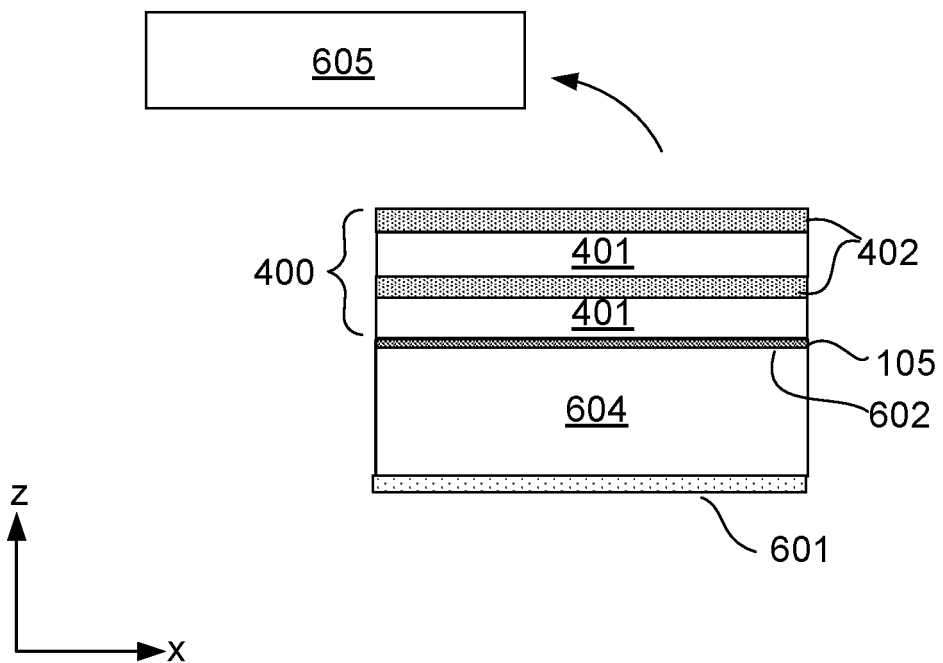

In FIGS. 6D-6E, a hybrid backside structure modules 400 is shown being transferred to an individual die 604. A pick-and-place operation may be employed to carry and position one or multiple hybrid backside structure modules 400. Each hybrid backside structure module 400 comprises a stack of interleaved layers 401 and 402. In some embodiments, the hybrid backside structure modules 400 have a thickness of 500 microns or less, and may be attached to carrier substrate 605 for mechanical support. Joining layer 105 may be activated to adhere hybrid backside structure 400 to die backside 602. In some embodiments, joining layer 105 comprises a solder or solder-like material that is reflowed to attach hybrid backside structure modules 400 to dies 604. In some embodiments, joining layer 105 comprises a thermal epoxy that is heat activated for adhesion. Carrier 605 may be removed before or after attachment of hybrid backside structure modules 400 to dies 604.

Figure 7:
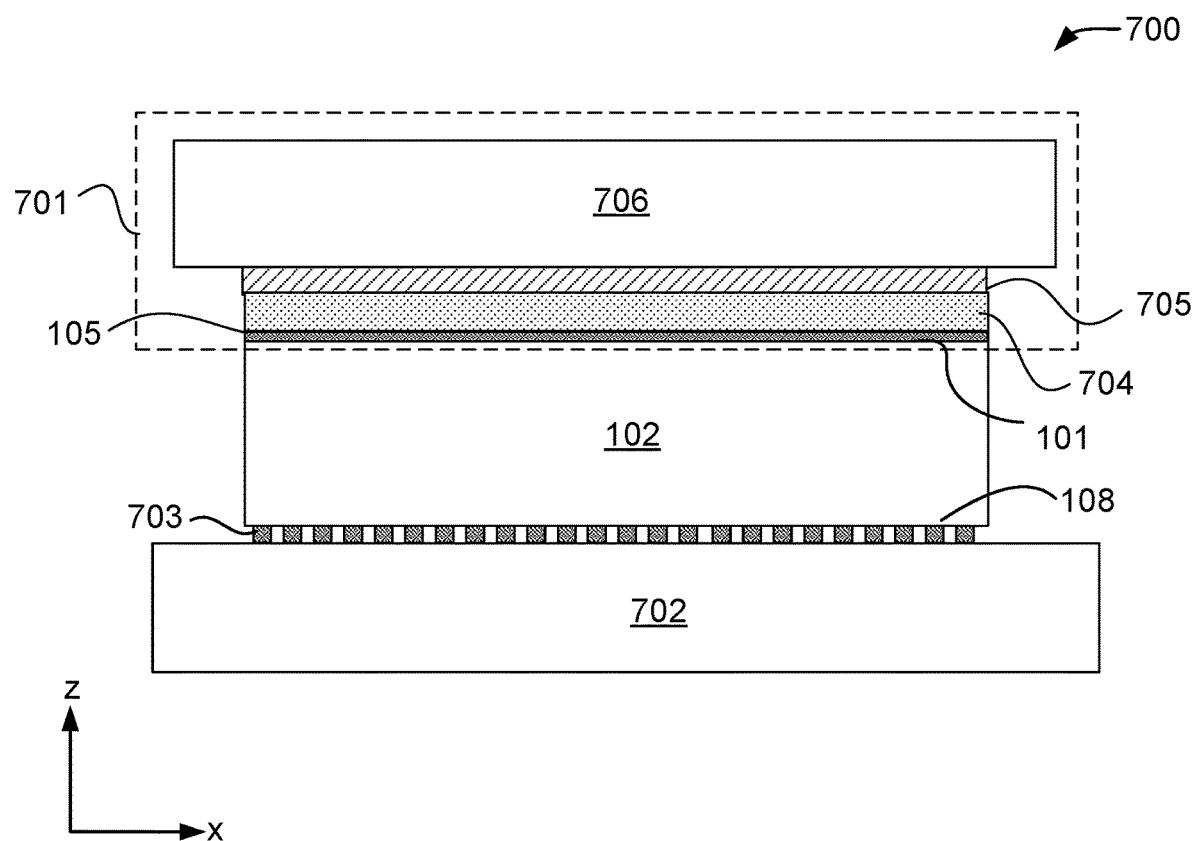
FIG. 7 illustrates a profile view in the x-z plane of a package comprising a hybrid backside structure, according to some embodiments of the disclosure.

FIG. 7 illustrates a profile view in the x-z plane of package 700, comprising hybrid backside structure 704, according to some embodiments of the disclosure.

Package 700 comprises thermal stack 701 over die 102 (attached to package substrate 702 by solder joints 703). Thermal stack 701 includes an integrated hybrid backside structure 704 (hybrid backside structures 100a, 100b or 100c are collectively referenced here as 704), TIM 705 and IHS 706. In some embodiments, IHS 706 may be interchangeable with a system level thermal solution (external to the package), such as a heat sink or cold plate with an attached heat pipe or vapor chamber. Hybrid backside structure 704 may be integrated directly on die backside 101 or onto joining layer 105, as described for hybrid backside structures 100a, 100b and 100c. Barrier and joining layers 106 and 107 are omitted in the figure, but may be optionally added. As noted above, hybrid backside structure 704 may have a thickness ranging between 20 microns and 500 microns. In some embodiments, hybrid backside structure 704 is a stand-alone package component (e.g., hybrid backside structure module 400) attached to die 102 by a pick-and-place operation during package assembly.

TIM 705 may comprise any number of suitable materials, ranging from a solder (e.g. indium, tin, or alloys of those and/or other materials), thermal grease, thermal paste, or liquid metal spread over hybrid backside structure 704, or in the form of solid composite pad comprising metal or graphite (or graphene) particles embedded in a polymer (such as silicone).

Figure 8:
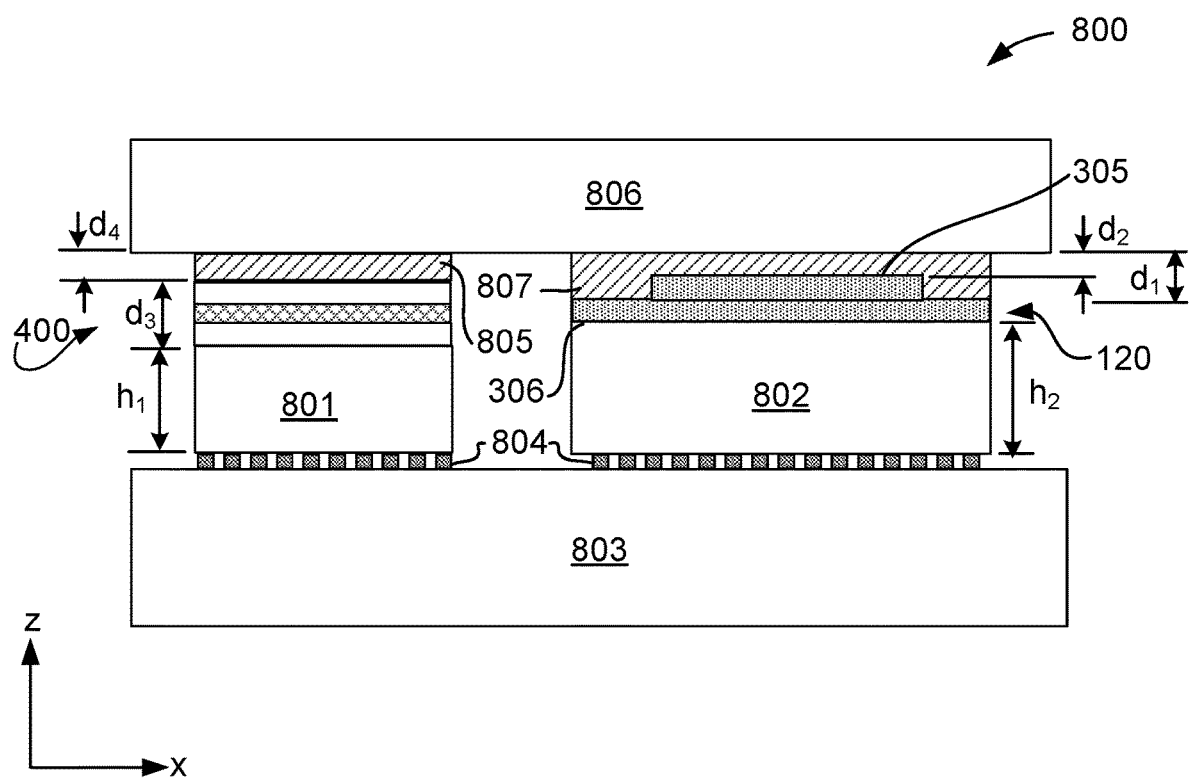
FIG. 8 illustrates a profile view in the x-z plane of a package assembled with multiple chips having different hybrid backside structures, according to some embodiments of the disclosure.

FIG. 8 illustrates a profile view in the x-z plane of package 800 assembled with multiple chips having different hybrid backside structures 400 and 120, according to some embodiments of the disclosure.

In the illustrated embodiment, package 800 is a multi-chip package comprising dies 801 and 802 electrically coupled to substrate 803 through solder joints 804. In the illustrated embodiment, die 801 is thermally coupled to TIM 805 and IHS 806 through hybrid backside structure module 400, whereas die 802 is coupled to TIM 807 and IHS 806 through hybrid backside structure 120. Package assembly options include in-situ fabrication and/or attachment of hybrid backside structures after die attach, or fabrication/attachment of hybrid backside structures onto dies 801 and 802 before die attach. Examples of fabrication and integration of hybrid backside structures onto dies (e.g., die 102) have been described in this disclosure and illustrated in FIGS. 3A-3H and 6A-6E.

Hybrid backside structure 400 may be grown in-situ on die 801 while attached to package substrate 803, or fabricated on die 801 before assembly into package 800 at wafer or chip level as described above. As described earlier, hybrid backside structure 120 comprises island 305 over base layer 306, where island 305 may have lateral dimensions in the x-y plane (e.g., dimension L in FIG. 3H) that are the same as or smaller than the lateral dimensions of base layer 306. Island 305 may have a z-height (e.g., thickness $z_1$ in FIG. 3H) that is the same, greater or less than the z-height of layer 306. A multi-tiered thermal interface such as hybrid backside structure 120 may enable better thermal contact and reduce thermal resistance between a region of die 802 where hotspots are likely to occur and IHS 806. As an example, TIM 807 may have a significantly smaller thermal conductivity than that of island 305. The additional z-height due to island 305 of hybrid backside structure 120 may reduce thickness of TIM layer 807 from $d_1$ to $d_2$, enabling a thinner TIM 807 layer over the thermally sensitive region of die 802 in the shadow of island 305. The reduction in the thickness of TIM 807 effectively replaces low thermal conductivity material of TIM 807 (generally a thermal grease or paste having a κ<10 W/m-K) with the high thermal conductivity (k>200 W/m-K) material of island 305. The additional z-height of island 305 may also increase pressure on TIM 807, reducing the likelihood of voids in the TIM in the shadow of island 305 and ensuring adequate thermal coupling.

In the illustrated embodiment, z-height $h_1$ of die 801 is smaller than $h_2$ of die 802, requiring a thicker thermal interface (e.g., a thicker TIM 805 in the absence of hybrid backside structure 400) to fill the gap between die 801 and IHS 806 than for die 802. Hybrid backside structure 400 has a z-height $d_3$ that, added to $h_1$ of die 801, may enable a smaller thickness $d_4$ of TIM 805. In the absence of hybrid backside structure 400, a larger thickness of TIM 805, which for example may be the sum of $d_3$ and $d_4$, may be required and may present a substantially greater thermal resistance between die 801 and IHS 806. Instead, in the illustrated embodiment, a substantial portion of the gap between die 801 and IHS 806 is filled with the composite material of hybrid backside structure 400 which has a significantly higher thermal conductivity than most typical TIM materials.

Figure 9:
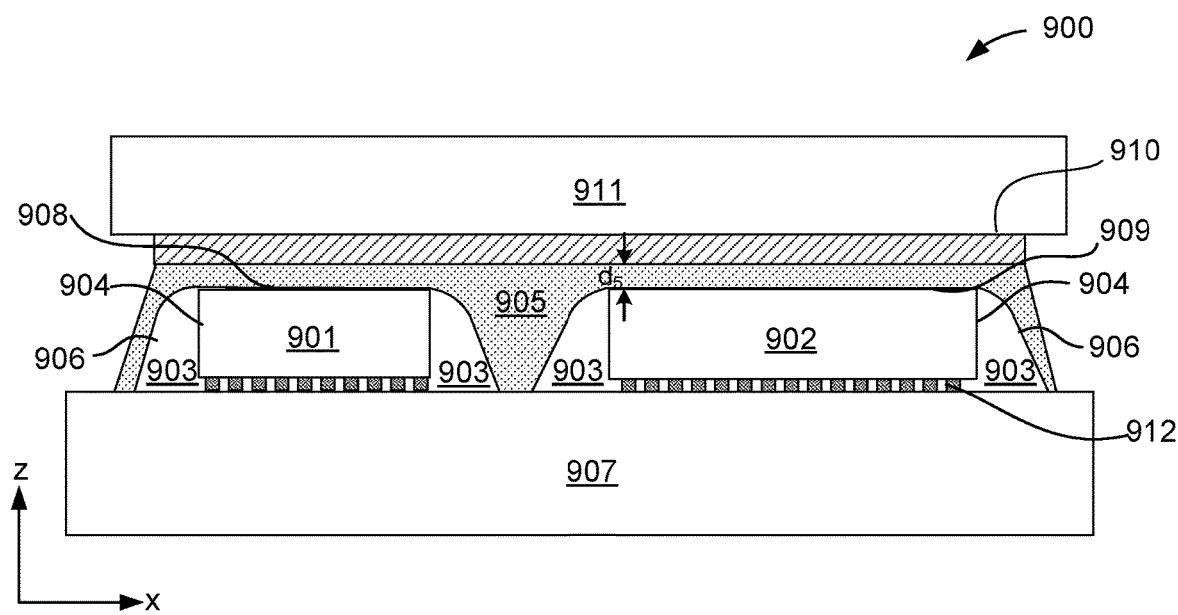
FIG. 9 illustrates a profile view in the x-z plane of a multichip package having a hybrid backside structure material filling space between dies, according to some embodiments of the disclosure.

FIG. 9 illustrates a profile view in the x-z plane of multichip package 900, having a hybrid backside structure material 905 filling space between dies, according to some embodiments of the disclosure.

While package 900 is shown in FIG. 9 to be a multi-die package, the following description is valid for single-chip packages. In the illustrated embodiment, dies 901 and 902 are encapsulated in underfill 903, covering die sidewalls 904. Hybrid backside structure material 905 fills in the space between underfill sidewalls 906 and over package substrate 907, and also extends over backside surfaces 908 and 909 of dies 901 and 902, respectively. A thickness $d_5$ of hybrid backside structure material 905 over die backside surfaces 908 and 909 may range from 20 to 500 microns. TIM 910 may be positioned between hybrid backside structure material 905 and IHS 911 for thermal coupling.

While hybrid backside structure material 905 is differentiated from a definitive structure, (e.g., as described in this disclosure for, as an example, hybrid backside structure 100a, 100b, 100c or 400), it may comprise the same materials from which the afore-mentioned embodiments 100a-c are fabricated. As an example, a cold spray process may be employed during package assembly to fill the space between dies and underfill after die attach and underfill operations. Hybrid backside structure material 905 may be produced by a cold spray operation to a desired thickness within several minutes or less. As an example, hybrid backside structure material 905 may be have a z-height comprising the z-height of the thickest die (e.g., 600 microns), and extending up to 150-200 microns over the thickest die, completely embedding dies 901 and 902. Heat produced from dies 901 and 902 during device operation may be more efficiently dispersed and dissipated within the relatively large volume of hybrid backside structure fill material 905 compared to a thinner two-dimensional layer of material confined only to the tops of dies (e.g., hybrid backside structures 704 and 400).

In some embodiments, hybrid backside structure material 905 may have a microstructure such as shown in FIG. 1A, 1B or 1C. Underfill 903 may isolate and protect solder joints 912 from potential contact with metal in the material 905 (e.g., matrix 104 in FIG. 1A).

Figure 10:
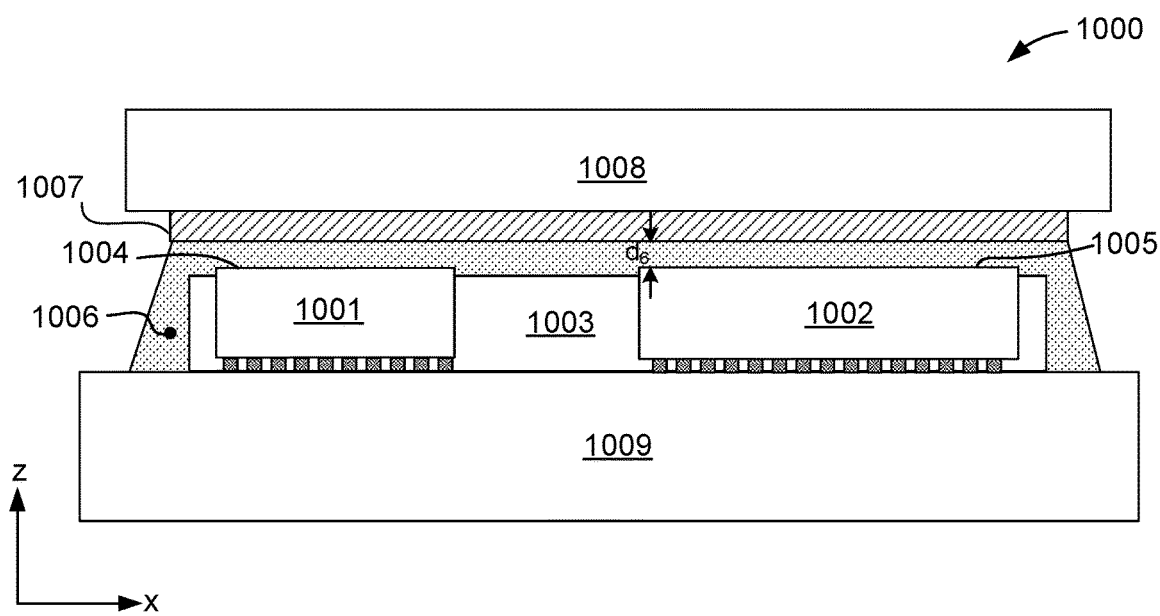
FIG. 10 illustrates a profile view in the x-z plane of a multichip package, having thermal interface material covering molding encapsulation, according to some embodiments of the disclosure.

FIG. 10 illustrates a profile view in the x-z plane of multichip package 1000, having a hybrid backside structure material 1006 covering molding encapsulation, according to embodiments of the disclosure.

While package 1000 is shown to be a multi-chip package in FIG. 10, the following description may be valid for single chip packages. In the illustrated embodiment, dies 1001 and 1002 are encapsulated in a package molding material 1003, which may comprise an epoxy resin encapsulating dies 1001 and 1002 after die attach operations are complete. In the illustrated embodiment, molding material 1003 is shown not to extend over die backside surfaces 1004 and 1005 (e.g. due to a mold back-grinding operation following the molding process). Hybrid backside structure material 1006 surrounds and encapsulates molding material 1003, and also extends by a thickness $d_6$ above backside surfaces 1004 and 1005 of dies 1001 and 1002, respectively. In some embodiments, thickness $d_6$ may range between 20 and 500 microns. TIM 1007 may be positioned between hybrid backside structure material 1006 and IHS 1008 for thermal coupling A three-dimensional configuration of hybrid backside structure material 1006 may enhance heat transfer from dies 1001 and 1002, particularly from hot spots. Heat may be spread into the large volume of the material 1006, reducing maximum die temperatures. Material 1006 may have contact with package substrate 1009, which may also help transfer heat from the substrate to IHS 1008 through material 1006.

Figure 11:
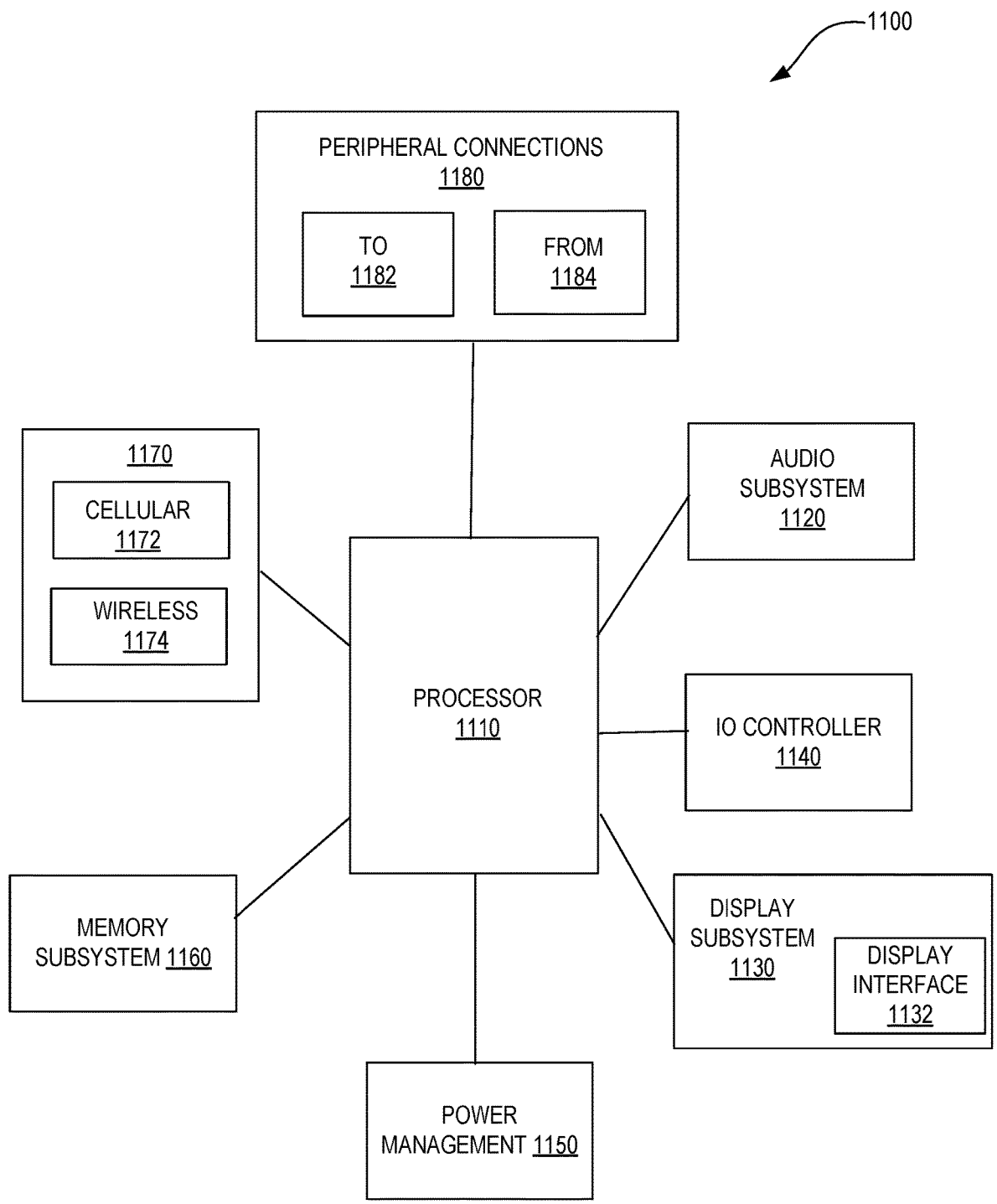
FIG. 11 illustrates a block diagram of a computing device as part of a system-on-chip (SoC) package in an implementation of a computing device, according to some embodiments of the disclosure.

FIG. 11 illustrates a block diagram of computing device 1100 as part of a system-on-chip (SoC) package in an implementation of a hybrid backside structure layer, according to some embodiments of the disclosure.

According to some embodiments, computing device 1100 represents a server, a desktop workstation, or a mobile workstation, such as, but not limited to, a laptop computer, a computing tablet, a mobile phone or smart-phone, a wireless-enabled e-reader, or other wireless mobile device.

In some embodiments, computing device 1100 has wireless connectivity (e.g., Bluetooth, WiFi and 5G network). It will be understood that certain components are shown generally, and not all components of such a device are shown in computing device 1100.

The various embodiments of the present disclosure may also comprise a network interface 1170 such as a wireless interface so that a system embodiment may be incorporated into a wireless device, for example, cell phone or personal digital assistant. The wireless interface includes a millimeter wave generator and antenna array. The millimeter wave generator may be part of a monolithic microwave integrated circuit.

According to some embodiments, processor 1110 represents a CPU or a GPU, and can include one or more physical devices, such as microprocessors, application processors, microcontrollers, programmable logic devices, or other processing means. Processor 1110 may comprise a hybrid backside structure (e.g., hybrid backside structure 100a, 100b, 100c, 400) or comprise a hybrid backside structure fill material (e.g., material 905 or 1006) as disclosed. The processing operations performed by processor 1110 include the execution of an operating platform or operating system on which applications and/or device functions are executed. The processing operations include operations related to I/O (input/output) with a human user or with other devices, operations related to power management, and/or operations related to connecting the computing device 1100 to another device. The processing operations may also include operations related to audio I/O and/or display I/O.

In one embodiment, computing device 1100 includes audio subsystem 1120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1100, or connected to the computing device 1100. In one embodiment, a user interacts with the computing device 1100 by providing audio commands that are received and processed by processor 1110

Display subsystem 1130 represents hardware (e.g., display devices) and software (e.g., drivers) components that provide a visual and/or tactile display for a user to interact with the computing device 1100. Display subsystem 1130 includes display interface 1132 which includes the particular screen or hardware device used to provide a display to a user. In one embodiment, display interface 1132 includes logic separate from processor 1110 to perform at least some processing related to the display. In one embodiment, display subsystem 1130 includes a touch screen (or touch pad) device that provides both output and input to a user.

I/O controller 1140 represents hardware devices and software components related to interaction with a user. I/O controller 1140 is operable to manage hardware that is part of audio subsystem 1120 and/or display subsystem 1130. Additionally, I/O controller 1140 illustrates a connection point for additional devices that connect to computing device 1100 through which a user might interact with the system. For example, devices that can be attached to the computing device 1100 might include microphone devices, speaker or stereo systems, video systems or other display devices, keyboard or keypad devices, or other I/O devices for use with specific applications such as card readers or other devices.

As mentioned above, I/O controller 1140 can interact with audio subsystem 1120 and/or display subsystem 1130. For example, input through a microphone or other audio device can provide input or commands for one or more applications or functions of the computing device 1100. Additionally, audio output can be provided instead of, or in addition to display output. In another example, if display subsystem 1130 includes a touch screen, the display device also acts as an input device, which can be at least partially managed by I/O controller 1140. There can also be additional buttons or switches on the computing device 1100 to provide I/O functions managed by I/O controller 1140.

In one embodiment, I/O controller 1140 manages devices such as accelerometers, cameras, light sensors or other environmental sensors, or other hardware that can be included in the computing device 1100. The input can be part of direct user interaction, as well as providing environmental input to the system to influence its operations (such as filtering for noise, adjusting displays for brightness detection, applying a flash for a camera, or other features).

In one embodiment, computing device 1100 includes power management 1150 that manages battery power usage, charging of the battery, and features related to power saving operation. Memory subsystem 1160 includes memory devices for storing information in computing device 1100. Memory can include nonvolatile (state does not change if power to the memory device is interrupted) and/or volatile (state is indeterminate if power to the memory device is interrupted) memory devices. Memory subsystem 1160 can store application data, user data, music, photos, documents, or other data, as well as system data (whether long-term or temporary) related to the execution of the applications and functions of the computing device 1100.

Elements of embodiments are also provided as a machine-readable medium (e.g., memory 1160) for storing the computer-executable instructions. The machine-readable medium (e.g., memory 1160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 1170 includes hardware devices (e.g., wireless and/or wired connectors and communication hardware) and software components (e.g., drivers, protocol stacks) to enable the computing device 1100 to communicate with external devices. The computing device 1100 could be separate devices, such as other computing devices, wireless access points or base stations, as well as peripherals such as headsets, printers, or other devices.

Network interface 1170 can include multiple different types of connectivity. To generalize, the computing device 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1180 include hardware interfaces and connectors, as well as software components (e.g., drivers, protocol stacks) to make peripheral connections. It will be understood that the computing device 1100 could both be a peripheral device ("to" 1182) to other computing devices, as well as have peripheral devices ("from" 1184) connected to it. The computing device 1100 commonly has a "docking" connector to connect to other computing devices for purposes such as managing (e.g., downloading and/or uploading, changing, synchronizing) content on computing device 1100. Additionally, a docking connector can allow computing device 1100 to connect to certain peripherals that allow the computing device 1100 to control content output, for example, to audiovisual or other systems.

In addition to a proprietary docking connector or other proprietary connection hardware, the computing device 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an integrated circuit (IC) die structure, comprising: a substrate material comprising silicon; integrated circuitry over a first side of the substrate material; and a composite layer in direct contact with a second side of the substrate material, opposite the first side, wherein the composite layer comprises: a first constituent material associated with a first linear coefficient of thermal expansion (CTE), and a first thermal conductivity exceeding that of the substrate; and a second constituent material associated with a second CTE that is lower than the first CTE by at least 5 ppm/K, and a second thermal conductivity exceeding that of the substrate.

Example 2 includes all of the features of example 1, wherein the composite layer has a thickness between 20 microns and 500 microns.

Example 3 includes all of the features of example 1, wherein the first constituent material has a higher ductility than the second constituent material.

Example 4 includes all of the features of examples 2 or 3, wherein the first constituent material is a metal and the second constituent material is a non-metal.

Example 5 includes all of the features of any one of examples 1 through 4, wherein the first thermal conductivity is at least 200 W/m-K; the second thermal conductivity is at least 200 W/m-K; the first CTE is over 10 ppm/K and the second CTE is less than 5 ppm/K.

Example 6 includes all of the features of any one of examples 1 through 5, wherein the substrate is associated with a third CTE that is between the first CTE and the second CTE.

Example 7 includes all of the features of any one of examples 1 through 5, wherein the second constituent material is at least one of aluminum nitride, silicon carbide, boron arsenide or diamond.

Example 8 includes all of the features of any one of examples 1 through 7, wherein the first constituent material is at least one of copper, silver or aluminum.

Example 9 includes all of the features of any one of examples 1 through 4, wherein the composite layer comprises particles of one of the first or second constituent materials embedded within another of the first or second constituent materials.

Example 10 includes all of the features of any one of examples 1 through 9, wherein the composite layer comprises particles of the second constituent material embedded within the first constituent material.

Example 11 includes all of the features of any one of examples 1 through 10, wherein the composite layer comprises a plurality of lamellae, individual ones of the lamellae comprising ones of the particles of the second constituent material clad by the first constituent material.

Example 12 includes all of the features of any one of examples 1 through 9, wherein the particles have a diameter greater than 1 micron.

Example 13 includes all of the features of any one of examples 1 through 12, wherein the substrate material has an edge sidewall, and wherein the composite layer is absent from the edge sidewall.

Example 14 includes all of the features of any one of examples 1 through 13, wherein the composite layer has a first thickness over a first region of the substrate material, and over a second region of the substrate material, the composite layer is absent or has a second thickness significantly less than the first thickness.

Example 15 includes all of the features of any one of examples 1 through 14, wherein the substrate comprises: a monocrystalline material layer that includes silicon; and at least one of a diffusion barrier material layer or an adhesion material layer between the composite layer and the monocrystalline material layer.

Example 16 includes all of the features of example 15, wherein the diffusion barrier material layer or the adhesion material layer comprises one or more of platinum, palladium, nickel, vanadium, tantalum, titanium, tungsten, chromium, copper, gold, silver, indium, tin, aluminum nitrogen or oxygen.

Example 17 is an integrated circuit (IC) device assembly, comprising an IC die structure, comprising a substrate material comprising silicon; integrated circuitry over a first side of the substrate material; and a composite layer in direct contact with a second side of the substrate material, opposite the first side, wherein the composite layer comprises a first constituent material associated with a first linear coefficient of thermal expansion (CTE), and a first thermal conductivity exceeding that of the substrate; and a second constituent material associated with a second CTE that is lower than the first CTE by at least 5 ppm/K, and a second thermal conductivity exceeding that of the substrate, and a thermal interface material (TIM) in contact with the composite layer.

Example 18 includes all of the features of example 17, wherein the IC die is a first IC die; the IC device assembly further comprises a second IC die adjacent to the first IC die; and a first portion of the composite layer is over the first IC die, a second portion of the composite layer is over the second IC die, and a third portion of the composite layer is over an intervening region between a first sidewall of the first IC die and a second sidewall of the second IC die.

Example 19 includes all of the features of examples 17 or 18, wherein there is a first difference in thickness between the first IC die and the second IC die; there is a second difference in thickness between the first and second portions of the composite layer, and the second difference in thickness at least partially compensates for the first difference in thickness.

Example 20 includes all of the features of examples 18 or 19, wherein an underfill material or a package mold material is within the intervening region and the third portion of the composite layer is over the underfill material or the package mold material.

Example 21 includes all of the features of any one of examples 18 through 20, further comprising a heat spreader or cooling solution in contact with the TIM.

Example 22 is a method of fabricating an integrated circuit (IC) die structure, the method comprising: receiving a substrate material comprising silicon with integrated circuitry over a first side of the substrate material; depositing a composite layer onto a second side of the substrate material opposite the first side, wherein the depositing comprises depositing first and second constituent materials, wherein the first constituent material is associated with a first linear coefficient of thermal expansion (CTE), and a first thermal conductivity exceeding that of the substrate, and wherein the second constituent material is associated with a second CTE that is lower than the first CTE, and is associated with a second thermal conductivity exceeding that of the substrate.

Example 23 includes all of the features of example 22, wherein depositing the first and second constituent materials comprises applying a clad-composite powder to the second side of the substrate, and wherein applying the clad-composite powder comprises a thermal spraying or cold spraying process.

Example 24 includes all of the features of example 23, wherein the clad composite powder comprises particles of one of the first or second constituent materials clad with another of the first or second constituent materials.

Example 25 includes all of the features of example 24, wherein the first constituent material is a metal, and the second constituent material comprises at least one of aluminum nitride, silicon carbide, boron arsenide or diamond.

An abstract is submitted with the understanding that it will not be used to limit the scope or meaning of the claims. The following claims are hereby incorporated into the detailed description, with each claim standing on its own as a separate embodiment.

We claim:

1. An apparatus, comprising:
   an integrated circuit (IC) die comprising integrated circuitry over a first side of a material layer comprising silicon, and a second side of the IC die opposite the first side of the material layer; and
   a composite layer on the second side of the IC die, wherein the composite layer comprises:
   a first constituent material having a first linear coefficient of thermal expansion (CTE) and a first thermal conductivity, the first thermal conductivity exceeding that of the material layer; and
   a second constituent material having a second CTE, the second CTE lower than the first CTE by at least 5 ppm/K, and a second thermal conductivity exceeding that of the material layer, wherein the composite layer comprises particles of one of the first or second constituent materials embedded within another of the first or second constituent materials.

2. The apparatus of claim 1, wherein the first thermal conductivity is at least 200 W/m-K, the second thermal conductivity is at least 200 W/m-K, the first CTE is over 10 ppm/K, and the second CTE is less than 5 ppm/K.

3. The apparatus of claim 1, wherein the composite layer comprises a plurality of lamellae, individual ones of the lamellae comprising ones of the particles of the first or second constituent material clad by the other of the first or second constituent materials.

4. The apparatus of claim 1, wherein the particles have a diameter greater than 1 μm.

5. The apparatus of claim 1, wherein the composite layer has a first thickness over a first region of the material layer and, over a second region of the material layer, the composite layer is absent or has a second thickness significantly less than the first thickness.

6. The apparatus of claim 1, wherein the IC die comprises at least one second material layer between the composite layer and the material layer, the at least one second material layer comprising one or more of platinum, palladium, nickel, vanadium, tantalum, titanium, tungsten, chromium, copper, gold, silver, indium, tin, aluminum, nitrogen, or oxygen.

7. The apparatus of claim 1, further comprising:
   a network interface or a display device coupled to the IC die.

8. An apparatus, comprising:
   an integrated circuit (IC) die comprising integrated circuitry over a first side of a material layer comprising silicon, and a second side of the IC die opposite the first side of the material layer; and
   a composite layer on the second side of the IC die, wherein the composite layer comprises:
   a first constituent material having a first linear coefficient of thermal expansion (CTE) and a first thermal conductivity, the first thermal conductivity exceeding that of the material layer; and
   a second constituent material having a second CTE, the second CTE lower than the first CTE by at least 5 ppm/K, and a second thermal conductivity exceeding that of the material layer, wherein the composite layer comprises particles of one of the second constituent material embedded within a matrix of the first constituent material.

9. The apparatus of claim 8, wherein the first thermal conductivity is at least 200 W/m-K, the second thermal conductivity is at least 200 W/m-K, the first CTE is over 10 ppm/K, and the second CTE is less than 5 ppm/K.

10. The apparatus of claim 8, wherein the first constituent material is a metal and the second constituent material is a non-metal.

11. The apparatus of claim 8, wherein the first constituent material comprises at least one of copper, silver, or aluminum, and wherein the second constituent material comprises at least one of aluminum nitride, silicon carbide, boron arsenide, or diamond.

12. The apparatus of claim 8, wherein the first constituent material has a higher ductility than the second constituent material.

13. The apparatus of claim 8, wherein the IC die comprises at least one second material layer between the composite layer and the material layer, the at least one second material layer comprising one or more of platinum, palladium, nickel, vanadium, tantalum, titanium, tungsten, chromium, copper, gold, silver, indium, tin, aluminum, nitrogen, or oxygen.

14. The apparatus of claim 8, further comprising:
   a network interface or a display device coupled to the IC die.

15. An apparatus, comprising:
   an integrated circuit (IC) die comprising integrated circuitry over a first side of a material layer comprising silicon, and a second side of the IC die opposite the first side of the material layer; and
   a composite layer on the second side of the IC die, wherein the composite layer comprises:

a first constituent material having a first linear coefficient of thermal expansion (CTE) and a first thermal conductivity, the first thermal conductivity exceeding that of the material layer; and a second constituent material having a second CTE, the second CTE lower than the first CTE by at least 5 ppm/K, and a second thermal conductivity exceeding that of the material layer, wherein the composite layer comprises alternating layers of the first constituent material and the second constituent material.

16. The apparatus of claim 15, wherein the first thermal conductivity is at least 200 W/m-K, the second thermal conductivity is at least 200 W/m-K, the first CTE is over 10 ppm/K, and the second CTE is less than 5 ppm/K.

17. The apparatus of claim 15, wherein the first constituent material is a metal and the second constituent material is a non-metal.

18. The apparatus of claim 15, wherein the first constituent material comprises at least one of copper, silver, or aluminum, and wherein the second constituent material comprises at least one of aluminum nitride, silicon carbide, boron arsenide, or diamond.

19. The apparatus of claim 15, wherein the IC die comprises at least one second material layer between the composite layer and the material layer, the at least one second material layer comprising one or more of platinum, palladium, nickel, vanadium, tantalum, titanium, tungsten, chromium, copper, gold, silver, indium, tin, aluminum, nitrogen, or oxygen.

20. The apparatus of claim 15, further comprising:
a network interface or a display device coupled to the IC die.

* * * * *